United States Patent
Yun et al.

(10) Patent No.: US 10,078,110 B2
(45) Date of Patent: Sep. 18, 2018

(54) SHORT CIRCUIT DETECTING DEVICE OF STACKED MEMORY CHIPS AND METHOD THEREOF

(71) Applicant: Samsung Electronics Co., Ltd., Suwon-si, Gyeonggi-do (KR)

(72) Inventors: Won-Joo Yun, Yongin-si (KR); Sukyong Kang, Suwon-si (KR); Hye-Seung Yu, Goyang-si (KR); Hyunui Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 68 days.

(21) Appl. No.: 15/295,244

(22) Filed: Oct. 17, 2016

(65) Prior Publication Data

US 2017/0219647 A1     Aug. 3, 2017

(30) Foreign Application Priority Data

Jan. 28, 2016 (KR) .................. 10-2016-0010749

(51) Int. Cl.
| | |
|---|---|
| *G01R 31/02* | (2006.01) |
| *G01R 31/26* | (2014.01) |
| *G01R 31/28* | (2006.01) |
| *H01L 21/66* | (2006.01) |
| *H01L 25/065* | (2006.01) |
| *H03K 17/687* | (2006.01) |
| *G11C 29/00* | (2006.01) |
| *G11C 29/02* | (2006.01) |
| *G11C 29/50* | (2006.01) |
| *G11C 5/02* | (2006.01) |

(52) U.S. Cl.
CPC ....... *G01R 31/2853* (2013.01); *G01R 31/025* (2013.01); *G01R 31/26* (2013.01); *G11C 29/006* (2013.01); *G11C 29/025* (2013.01); *G11C 29/50008* (2013.01); *H01L 22/14* (2013.01); *H01L 25/0657* (2013.01); *H03K 17/6872* (2013.01); *G01R 31/2884* (2013.01); *G11C 5/025* (2013.01); *H01L 2224/16227* (2013.01); *H01L 2225/06513* (2013.01); *H01L 2225/06596* (2013.01); *H01L 2924/15311* (2013.01)

(58) Field of Classification Search
CPC ........................ G01R 31/2853; G01R 31/26; G01R 31/2884; G11C 29/025
USPC .................................. 324/500, 537, 762.01
See application file for complete search history.

(56) References Cited

U.S. PATENT DOCUMENTS

| | | |
|---|---|---|
| 5,621,740 A | 4/1997 | Kamada |
| 6,163,867 A | 12/2000 | Miller et al. |
| 6,717,235 B2 | 4/2004 | Komoike |
| 6,918,073 B2 | 7/2005 | Linam et al. |
| 6,963,212 B2 | 11/2005 | Brown |
| 7,330,043 B2 | 2/2008 | Yamamoto et al. |

(Continued)

FOREIGN PATENT DOCUMENTS

KR     10-2012-0062281     6/2012

*Primary Examiner* — Giovanni Astacio-Oquendo
(74) *Attorney, Agent, or Firm* — Harness, Dickey & Pierce, P.L.C.

(57) ABSTRACT

Disclosed are a method and a device for detecting a short circuit between adjacent micro-bumps. The method includes setting outputs of a pull-up driver and a pull-down driver of a data output circuit connected with a micro-bump to be suitable for a test type and determining whether a short circuit is generated.

20 Claims, 17 Drawing Sheets

(56) References Cited

U.S. PATENT DOCUMENTS

| | | | |
|---|---|---|---|
| 8,823,409 B2 | 9/2014 | Lee | |
| 2004/0220538 A1* | 11/2004 | Panopoulos | A61F 13/42 604/361 |
| 2005/0046439 A1* | 3/2005 | Yu | G09G 3/006 324/760.02 |
| 2012/0138927 A1 | 6/2012 | Kang | |
| 2013/0307548 A1* | 11/2013 | Lee | H01L 27/124 324/414 |
| 2015/0145524 A1* | 5/2015 | Duncan | G01R 31/024 324/538 |
| 2016/0054370 A1* | 2/2016 | Fomin | G01R 31/025 324/509 |
| 2016/0178689 A1* | 6/2016 | Okita | G01R 31/024 324/509 |

* cited by examiner

SHORT CIRCUIT DETECTING DEVICE OF STACKED MEMORY CHIPS AND METHOD THEREOF

CROSS-REFERENCE TO RELATED APPLICATIONS

A claim for priority under 35 U.S.C. § 119 is made to Korean Patent Application No. 10-2016-0010749 filed Jan. 28, 2016, in the Korean Intellectual Property Office, the entire contents of which are hereby incorporated by reference.

BACKGROUND

Example embodiments of the inventive concepts relate to detecting a short circuit (or, alternatively, an electrical connection) in a stacked memory chip. For example, at least some example embodiments relate to a technology for detecting an erroneous chip operation due to a short circuit between adjacent micro-bumps in the stacked memory chip.

In general, semiconductor chips are manufactured by processing a wafer using various semiconductor processes, and a semiconductor package is manufactured by packing the semiconductor chips. A semiconductor chip and a semiconductor package may be connected using bonding wires, bumps, or micro-bumps. For this reason, it may be desirable to test whether bumps are connected normally with the semiconductor chip, before a semiconductor packaging process.

SUMMARY

Example embodiments of the inventive concepts provide a device and/or a method capable of testing a short circuit between adjacent micro-bumps, thereby reducing the probability of (or, alternatively, preventing) an abnormal operation of a memory chip due to a short circuit between each bump or micro-bump (hereinafter referred to as a "micro-bump") and a micro-bump adjacent thereto. In particular, since some micro-bumps are located between stacked memory chips, it may be difficult to test the micro-bumps through physical probing at the outside. Accordingly, example embodiments of the inventive concepts provide a method of testing a short circuit between adjacent micro-bumps through a test circuit included in each memory chip.

One aspect of example embodiments of the inventive concepts is directed to provide a short circuit detecting circuit for a semiconductor chip micro-bump which includes a plurality of data input/output pads DQ_PAD connected to a plurality of micro-bumps, a plurality of data output circuits each including a pull-up driver and a pull-down driver and driving the data input/output pad, a pull-up driver output control circuit configured to select one of an off state, a weak-on state, and a strong-on state as an output of a pull-up driver, a pull-down driver output control circuit configured to select one of the off state, the weak-on state, and the strong-on state, wherein an output of a pull-down driver is driven according to the selected state, a test input data storage circuit, and a test output data storage circuit. The outputs of the pull-up driver and the pull-down driver of each data output circuit is set to one of the off state, the weak-on state, and the strong-on state based on a micro-bump short circuit test type.

Another aspect of example embodiments of the inventive concepts is directed to provide a semiconductor package which includes a first semiconductor device connected with a plurality of micro-bumps, a second semiconductor device connected with the plurality of micro-bumps and vertically stacked on the first semiconductor device, a plurality of bulk bumps connected with the plurality of micro-bumps by through-silicon vias. The second semiconductor device includes a short circuit detecting circuit for a semiconductor chip micro-bump which includes a plurality of data input/output pads connected to the plurality of micro-bumps, a plurality of data output circuits each including a pull-up driver and a pull-down driver and driving the data input/output pad, a pull-up driver output control circuit configured to select one of an off state, a weak-on state, and a strong-on state and operate an output of a pull-up driver according to the selected state, a pull-down driver output control circuit configured to select one of the off state, the weak-on state, and the strong-on state, wherein an output of a pull-down driver is driven according to the selected state, a test input data storage circuit, and a test output data storage circuit. The outputs of the pull-up driver and the pull-down driver of each data output circuit are set to one of the off state, the weak-on state, and the strong-on state based on a micro-bump short circuit test type.

Still another aspect of example embodiments of the inventive concepts is directed to provide a micro-bump short circuit detecting method of a semiconductor chip. The method includes supplying a micro-bump short circuit test signal to the semiconductor chip including a plurality of micro-bumps, setting outputs of a pull-up driver and a pull-down driver of each of a plurality of data output circuits to one of an off state, a weak-on state, and a strong-on state based on a micro-bump short circuit test type, storing test input in a test input data storage circuit, driving a data output circuit, storing an output of each of the data output circuits in a test output data storage circuit, outputting test output in a test output data storage circuit, and detecting a micro-bump short circuit by comparing the test input and the test output.

The micro-bump short circuit test type may include at least one of an operation of testing a short circuit between a micro-bump and a ground voltage, an operation of testing a short circuit between a micro-bump and a power supply voltage, and an operation of testing a short circuit between adjacent micro-bumps.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

In this specification, "ON" may mean that semiconductor devices, circuits, etc. are operating or that an electrical signal flows through the semiconductor devices, circuit, etc. "OFF" may mean that semiconductor devices, circuits, etc. do not operate or that an electrical signal does not flow through the semiconductor devices, circuit, etc.

Figure 1:
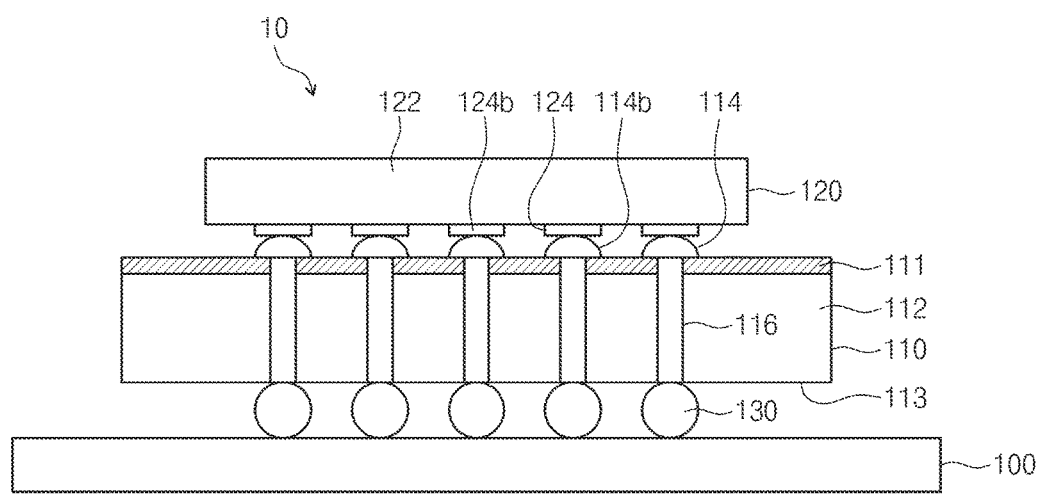
FIG. 1 is a sectional view illustrating a semiconductor package including micro-bumps.

FIG. 1 is a sectional view illustrating a semiconductor package including micro-bumps.

Referring to FIG. 1, a semiconductor package 10 including micro-bumps may be configured such that a first semiconductor device 110 and a second semiconductor device 120 are stacked on a package board 100. The first semiconductor device 110 and the second semiconductor device 120 may be electrically connected by micro-bumps 114 and 124.

At least one of the first and second semiconductor devices 110 and 120 may be a memory device. In some example embodiments, as described below, the first semiconductor device 110 may be a logic chip and the second semiconductor device 120 may be a memory device. However, example embodiments are not limited thereto. Each of the first and second semiconductor devices 110 and 120 may be implemented with a logic chip.

The first semiconductor device 110 may be a logic chip mounted on the package board 100 in a face-up structure in one surface (or an inactive surface) 113 of the first semiconductor device 110 faces the package board 100 and the opposite surface (or an active surface) 111 thereof faces the second semiconductor device 120. Integrated circuit patterns may be formed on the active surface 111 of the first semiconductor device 110.

The micro-bump 114 is formed on a chip pad that is formed on the active surface 111 of the first semiconductor device 110. The micro-bump 114 may have a hemispherical or convex shape and may contain nickel (Ni), gold (Au), copper (Cu), or solder alloy. The micro-bump 114 may have a diameter ranging from 8 to 50 um.

The micro-bump 114 of the first semiconductor device 110 may be formed at a central portion of a substrate 112. The micro-bump 114 is electrically connected to the second semiconductor device 120 and is used for internal input/output. In this specification, the term "internal input/output" may mean data input/output between chips. That is, the term "internal input/output" may mean data input/output between the first and second semiconductor devices 110 and 120.

In the first semiconductor device 110, the substrate 112 may include at least one or more through-silicon vias (TSV) 116 for external input/output. In this specification, the term "external input/output" may mean data input/output between a chip and a package board, that is, between the second semiconductor device 120 and the package board 100.

The at least one or more TSVs 116 may be formed by filling holes formed at the center portion of the substrate 112 with a conduction material.

The second semiconductor device 120 may be a memory or logic device that is mounted on the active surface 111 of the first semiconductor device 110. The micro-bump 124 of the second semiconductor device 120 may be formed at a central portion of a substrate.

The second semiconductor device 120 may be electrically connected by at least one or more micro-bumps 124 to the first semiconductor device 110. The micro-bump 124 of the second semiconductor device 120 and the micro-bump 114 of the first semiconductor device 110 may be connected to each other. For example, the second semiconductor device 120 may be mounted on the first semiconductor device 110 in a flip-chip manner.

Alternatively, the first semiconductor device 110 and the second semiconductor device 120 may be heterogeneous chips or homogeneous chips that have the same chip size. In an embodiment, when the first and second semiconductor devices 110 and 120 are homogeneous memory devices constituting a wide input/output bus, the wide input/output bus may connect the integrated circuits through the micro-bumps 114 and 124 and the TSVs 116 that are formed at a central portion of the substrate 112. In this case, the micro-bumps 114 and 124 that are formed at center portions of substrates 112 and 122 of the first and second semiconductor devices 110 and 120 may be used as wide input/output balls.

The package board 100 may be, for example, a printed circuit board (PCB). The package board 100 may be electrically connected with the first semiconductor device 110 through at least one or more TSVs 116 and at least one or more hulk bumps 130 connected thereto. Volumes and heights of bulk bumps 130 may be greater than those of the micro-bumps 114. Since the bulk bumps 130 of a relatively large size are arranged between the substrate 112 and the package board 100, the first semiconductor device 110 may endure a stress applied thereto, and thus mechanical durability of the semiconductor package 10 may be improved.

The TSVs 116 may electrically connect the first semiconductor device 110 with the package board 100. To implement the wide input/output bus, each of the TSVs 116 may be formed to have a fine pitch of about 100 um or less. As such, since a space between the micro-bump 114 and a micro-bump 114b adjacent thereto and a space between a micro-bump 124 and a micro-bump 124b adjacent thereto are reduced, the probability that the micro-bumps are short-circuited to each other during a chip stacking process may increase.

After the second semiconductor device 120 is stacked on the first semiconductor device 110, the micro-bumps 114 and 124 may be located between the first and second semiconductor devices 110 and 120. In this case, it may be difficult to detect a short circuit between the micro-bumps 114 and 124 and another micro-bump by physically probing the micro-bumps 114 and 124. A short circuit (or an electrical connection) between the micro-bumps 114 and 124 and the micro-bumps 114b and 124b adjacent thereto may cause a semiconductor device to operate abnormally, thereby degrading the reliability and productivity of the semiconductor device. Accordingly, at least some example embodiments are directed to detecting whether the micro-bumps 114 and 124 are electrically connected to the micro-bumps 114b and 124b adjacent thereto.

In this case that the micro-bumps 114 and 124 are electrically connected to each other, this short circuit may affect the bulk bumps 130 through the TSVs 116. A test apparatus may detect the short circuit between the micro-bumps 114 and 124 by testing the bulk bumps 130.

Productivity may be improved by reducing the number of pins of a semiconductor device to be tested, that is, the number of bulk bumps to be connected with the test apparatus. Therefore, example embodiments of the inventive concepts provide a device and/or a method that uses a reduced (or, alternatively, a minimum number of pins). For example, the device and/or method may use only one pin.

Figure 2:
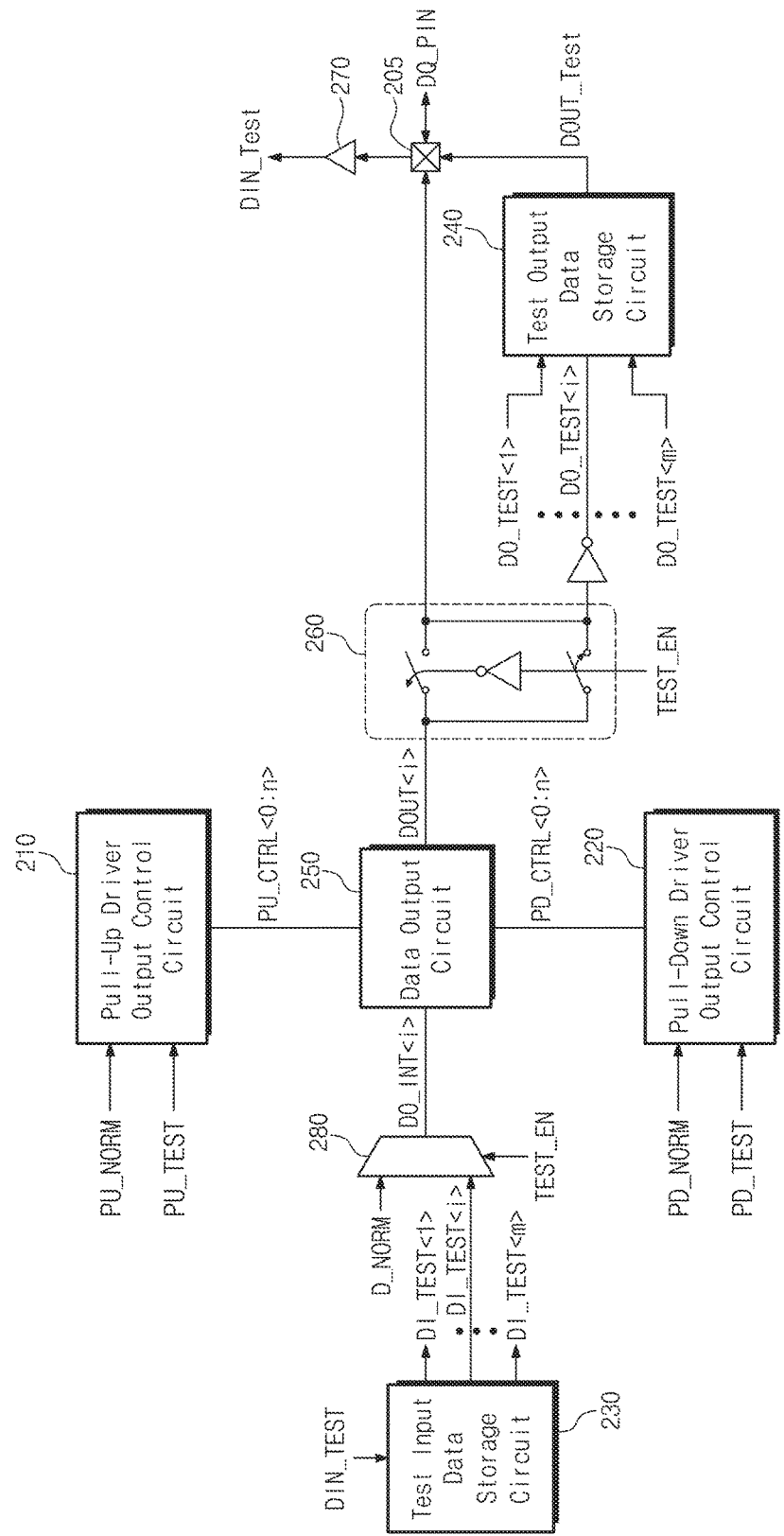
FIG. 2 is a block diagram illustrating a micro-bump short circuit detecting circuit according to an example embodiment of the inventive concepts.
Figure 3:
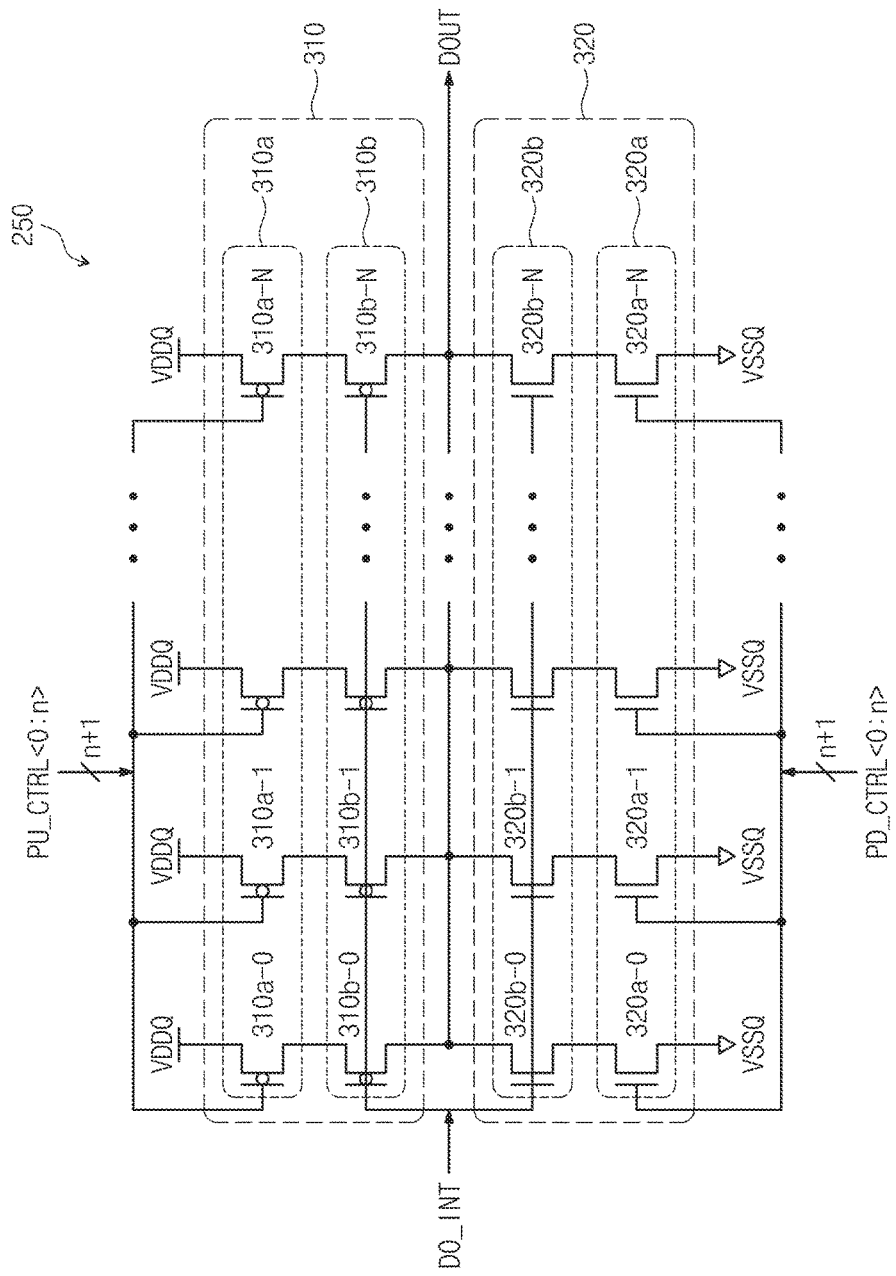
FIG. 3 is a detailed diagram of a data output circuit of FIG. 2.

FIG. 2 is a block diagram illustrating a micro-bump short circuit detecting circuit of a semiconductor chip according to an example embodiment of the inventive concepts. FIG. 3 is a detailed circuit diagram of a data output circuit 250 of FIG. 2.

An example embodiment of the inventive concepts will be described with respect to a short circuit detecting circuit (or referred to as a "micro-bump short circuit detecting circuit") located in the first semiconductor device 110. However, the short circuit detecting circuit may be applied to the second semiconductor device 120 in the same manner.

Referring to FIGS. 2 and 3, the short circuit detecting circuit according to an embodiment of the inventive concept includes a plurality of data input/output pads 205 connected to a plurality of micro-bumps, a plurality of data output circuits 250 including a pull-up driver and a pull-down driver, a pull-up driver output control circuit 210 selecting one of a plurality of output states, a pull-down driver output control circuit 220 selecting one of the plurality of output states, a test input data storage circuit 230, and a test output data storage circuit 240. The plurality of output stages selected by each of pull-up driver output control circuit 210 and the pull-down driver output control circuit 220 may include an off state, a weak-on state, and a strong-on state.

For descriptive convenience, FIG. 2 illustrates one of the data output circuits 250. However, the data output circuits 250 may be respectively connected to micro-bumps and may output test output data DO_TEST<i>. In addition, the data output circuits 250 may receive test input data DI_TEST<i> and may operate according to the received test input data DI_TEST<i>.

An output of a pull-up driver 310 in the data output circuit 250 may be controlled by the pull-up driver output control circuit 210, and an output of a pull-down driver 320 therein may be controlled by the pull-down driver output control circuit 220. The outputs of the pull-up and pull-down drivers 310 and 320 in the data output circuit 250 may be selected to have one among the off state, the weak-on state, and the strong-on state based on a type of micro-bump short-circuit test.

During a micro-bump test operation, the pull-up driver output control circuit 210 may include a pull-up control register as a control circuit that controls an output of the pull-up driver 310. For example, the pull-up control register may be implemented with (n+1) registers being registers <0> to <n>. Each of the registers may generate a pull-up driver output control signal PU_CTRL<i> of the pull-up driver 310 and may provide the generated pull-up driver output control signal PU_CTRL<i> to the pull-up driver 310 of the data output circuit 250. In other words, the registers may control ON or OFF states of pull-up elements 310a-0 to 310a-N to adjust an output of the pull-up driver 310. The number of pull-up driver output control signals and the number of pull-up elements may be set to (n+1), respectively.

When the second semiconductor device 120 does not perform an operation (hereinafter referred to as a "short-circuit test operation") of testing a short circuit between micro-bumps but a normal output operation, the pull-up driver output control circuit 210 may set an output of the pull-up driver 310 to be suitable for outputting data. The output of the pull-up driver 310 may be set when the second semiconductor device 120 is powered on. The output of the pull-up driver 310 may be finely adjusted during the operation of the second semiconductor device 120.

When the second semiconductor device 120 performs the short-circuit test operation, the pull-up control register of the pull-up driver output control circuit 210 may be set by a test mode register set (TMRS) operation. The TMRS operation may mean an operation in which a semiconductor device operates according to operation parameters that are stored before a normal operation of a semiconductor chip.

The pull-down driver output control circuit 220 may include a pull-up control register as a control circuit that controls an output of the pull-down driver 320 during the short-circuit test operation. For example, the pull-down control register may be implemented with (n+1) registers being registers <0> to <n>. Each of the registers may generate a pull-down driver output control signal PD_CTRL<i> of the pull-up driver 320 and may provide the generated pull-down driver output control signal PD_CTRL<i> to the pull-down driver 320 of the data output circuit 250. In other words, the registers may control ON or OFF states of pull-down elements 320a-0 to 320a-N to adjust an output of the pull-down driver 320. The number of pull-down driver output control signals and the number of pull-down elements of the pull-down control circuit 320a may be set to (n+1), respectively.

When the second semiconductor device 120 does not perform the short-circuit test operation but a normal output operation, the pull-down driver output control circuit 220 may set an output of the pull-down driver 320 to be suitable for outputting data. The output of the pull-down driver 320 may be set when the second semiconductor device 120 is powered on. The output of the pull-down driver 320 may be finely adjusted during the operation of the second semiconductor device 120. When the second semiconductor device 120 performs the short-circuit test operation, the pull-down control register of the pull-down driver output control circuit 220 may be set by the TMRS operation.

The test input data storage circuit 230 stores a value to be provided to the data output circuit 250 during an operation of testing micro-bumps. The test input data storage circuit 230 may be implemented with an input shift register that includes a plurality of registers. For example, when the number of micro-bumps to be tested is "m", the number of data output circuits connected to the micro-bumps may be "m". Accordingly, the input shift register of the test input data storage circuit 230 may be implemented with m registers. Each register of the input shift register may be configured such that an output thereof is used as an input of a data output circuit corresponding to the input shift register. For example, an i-th output of the input shift register of the test input data storage circuit 230 may be used as an input of an i-th data input circuit. Here, "i" may be a natural number of 1 to m.

As described above, the test input data storage circuit 230 may be implemented with a shift register. The reason is to receive a test data DIN_TEST through one external pin DQ_PIN. In the case that the second semiconductor device 120 includes a plurality of test pins, the test input data storage circuit 230 may be implemented with registers, which are respectively connected in parallel to test pins, in place of the input shifter register.

Each output of the test input data storage circuit 230, that is, test input data DI_TEST<i> may be provided to the data output circuit 250 through an input data selection circuit 280 when a micro-bump test signal TEST_EN is enabled. During a normal data output operation, the micro-bump test signal TEST_EN may be disabled. In this case, the input data selection circuit 280 may select normal output data D_NORM so as to be provided to the data output circuit 250.

Data provided to the data output circuit 250 may be sent to a pull-up drive device 310b of the pull-up driver 310 and a pull-down drive device 320b of the pull-down driver 320 such that the data output circuit 250 outputs data.

The test output data storage circuit 240 may store an output of the data output circuit 250, that is, test output data DO_TEST<1> to DO_TEST<m> during the short-circuit test operation. The test output data storage circuit 240 may be implemented with an output shifter register including a plurality of registers. For example, when the number of micro-bumps to be tested is "m", the number of data output circuits connected to the micro-bumps may be "m". Accordingly, the output shift register of the test output data storage circuit 240 may be implemented with m registers. Each register of the output shift register may be configured such that an input thereof is used as an output of a data output circuit corresponding to the output shift register. For example, an i$^{th}$ output of the output shift register of the test output data storage circuit 240 may be used as an input of an (i+1)$^{th}$ data input circuit. Here, "i" may be a natural number of 1 to m.

As described above, the test output data storage circuit 240 may be implemented with a shift register. The reason is to receive a test data DIN_TEST through one external pin DQ_PIN. In the case that the second semiconductor device 120 includes a plurality of test pins, the test input data storage circuit 230 may be implemented with registers, which are respectively connected in parallel to test pins, in place of the output shifter register.

Each output of the data output circuit 250 may be provided to the test output data storage circuit 240 through an output data selection circuit 260 when the micro-bump test signal TEST_EN is enabled. During the normal data output operation, the micro-bump test signal TEST_EN may be disabled. In this case, the output data selection circuit 260 may select normal output data so as to be output through a data pin (or a data input/output pad) 205.

Figure 4:
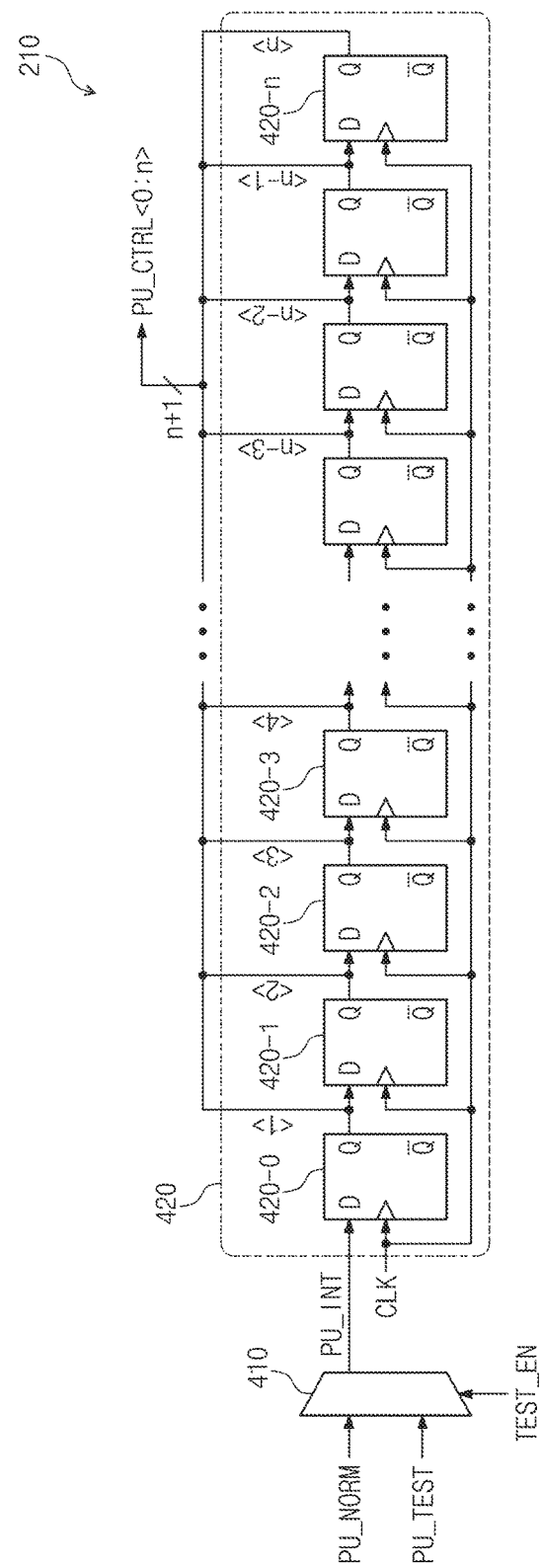
FIG. 4 is a block diagram illustrating a pull-up output control circuit according to an example embodiment of the inventive concepts.

FIG. 4 is a block diagram illustrating an operation of the pull-up driver output control circuit 210 according to an example embodiment of the inventive concepts.

Referring to FIG. 4, the pull-up driver output control circuit 210 may receive a data pull-up control input PU_NORM for setting a normal data output operation and a test pull-up control input PU_TEST for setting during the short-circuit test operation, and a pull-up control selection circuit 410 may select one of the pull-up control inputs PU_NORM and PU_TEST in response to the micro-bump test signal TEST_EN.

An operation in which the pull-up driver output control circuit 210 sets an output of the pull-up driver 310 according to some example embodiments is described below.

When the micro-bump test signal TEST_EN has a first logical level, for example, a level thereof is logical low, the pull-up control selection circuit 410 may select a data pull-up control input PU_NORM for a normal operation so as to be provided to a pull-up shift register 420 of the pull-up driver output control circuit 210. Low-level or high-level signals that are stored in the pull-up shift register 420 may be provided to the pull-up control circuit 310a of the pull-up driver 310 to adjust an output of the pull-up driver 310.

For example, in the case where "HHHH . . . HLLL" are provided to the shift register 420, the pull-up shift register 420 may output pull-up driver output control signals PU_CTRL<0> to PU_CTRL<n> of "HHHH . . . HLLL" to be provided to the pull-up control circuit 310a. Accordingly, in the example embodiment of FIG. 4, (n−2) pull-up elements 310a-0 to 310a-(N-3) of the pull-up control circuit 310a to which pull-up driver output control signals of logical high are respectively applied may be turned off, and three pull-up elements 310a-(N-2) to 310a-n of the pull-up control circuit 310a to which pull-up driver output control signals of logical low are respectively applied may be turned on. The turned-on pull-up elements may operate as a current path for a pull-up operation of the data output circuit 250. The driving capacity of the pull-up driver 310 may increase by increasing the number of low-level signals stored in the pull-up shift register 420 of the pull-up output control circuit, that is, by increasing the number of pull-up elements 310a-0 to 310a-N to be turned on. In contrast, the driving capacity of the pull-up driver 310 may decrease by increasing the number of high-level signals stored in the pull-up shift register 420 of the pull-up output control circuit, that is, by increasing the number of pull-up elements 310a-0 to 310a-N to be turned off.

In the case where the pull-up driver output control circuit 210 sets the pull-up driver 310 for the short-circuit test operation, the micro-bump test signal TEST_EN may be set to logical high. The pull-up control selection circuit 410 selects the test pull-up control input PU_TEST for the short-circuit test operation, and the selected test pull-up control input PU_TEST may be provided to the pull-up shift register 420 of the pull-up driver output control circuit 210. Low-level or high-level signals that are stored in the pull-up shift register 420 may be provided to the pull-up control circuit 310a (or pull-up elements) of the pull-up driver 310 to adjust an output of the pull-up driver 310.

For example, in the case where "HHHH . . . HHHL" are provided to the register 420, the pull-up shift register 420 may output pull-up driver output control signals PU_CTRL<0> to PU_CTRL<n> of "HHHH . . . HHHL" to be provided to the pull-up control circuit 310a. Accordingly, n pull-up elements 310a-0 to 310a-(N-1) of the pull-up control circuit 310a to which pull-up driver output control signals of logical high are respectively applied may be turned off, and one pull-up element 310a-N of the pull-up control circuit 310a to which a pull-up driver output control signal of logical low is applied may be turned on. The turned-on pull-up element may operate as a current path for a pull-up operation of the data output circuit 250.

In the case where only one pull-up element 310a is turned on, an output of the pull-up driver 310 may be relatively small. This may be referred to as a "weak-on state". However, embodiments are not limited thereto. The number of pull-up elements 310a-0 to 310a-N to be turned on for the weak-on state may be variously changed. In other example embodiments, an output of the pull-up driver 310 at the weak-on state may decrease more and more by lowering a current driving capacity, that is, by making a channel length of a weakly turned-on pull-up element greater than that of another pull-up element 310a.

In the case where all pull-up elements 310a-0 to 310a-N of the pull-up control circuit 310a are turned on, an output of the pull-up driver 310 may be relatively great. This may be referred to as a "strong-on state". However, example embodiments are not limited thereto. For example, the number of pull-up elements 310a-0 to 310a-N to be turned on for the strong-on state may be variously changed.

In the case where all pull-up elements 310a-0 to 310a-N of the pull-up control circuit 310a are turned off, an output of the pull-up driver 310 may scarcely exist. This may be referred to as an "off state".

The pull-up control circuit 310a may be implemented with PMOS transistors.

Figure 5:
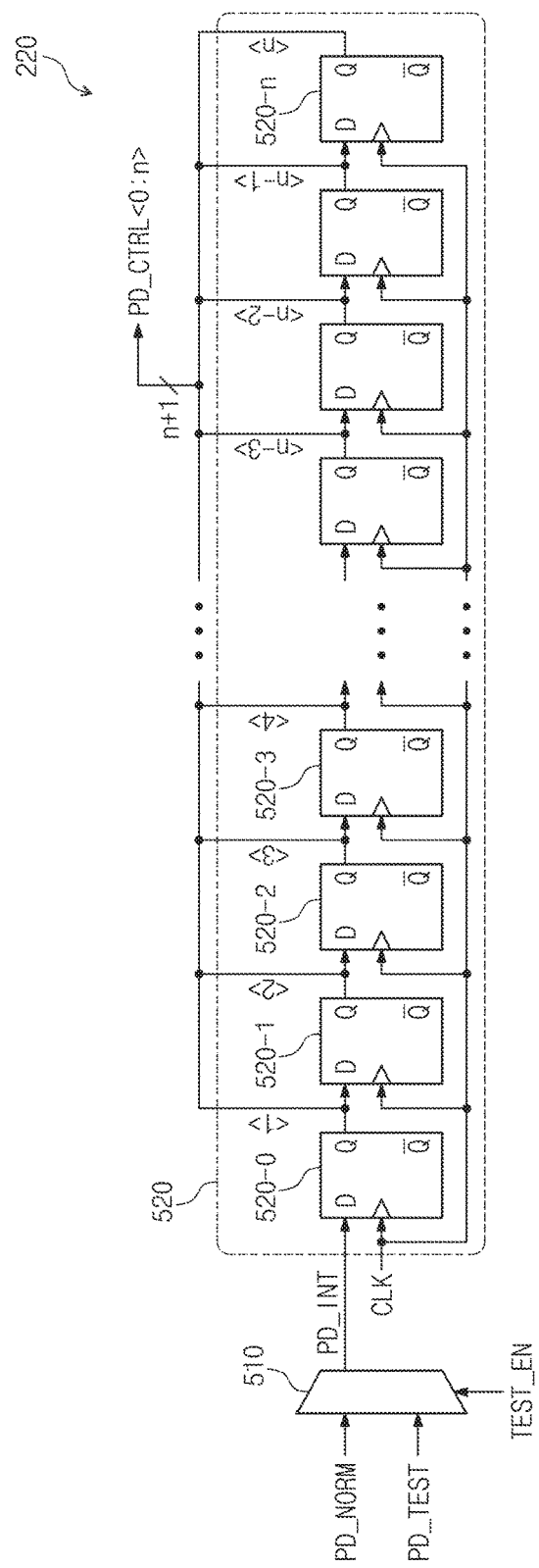
FIG. 5 is a block diagram illustrating a pull-down output control circuit according to an example embodiment of the inventive concepts.

FIG. 5 is a block diagram illustrating the pull-down driver output control circuit 220 according to an example embodiment of the inventive concepts.

Referring to FIG. 5, the pull-down driver output control circuit 220 performs a pull-down output control operation for outputting normal data and a pull-down output control operation for performing the short-circuit test operation like the pull-up driver output control circuit 210. During the pull-down output control operation, the micro-bump test signal TEST_EN may be set to a first logic level, for example, logical low. A pull-down control selection circuit 510 selects data pull-down input PD_NORM for the pull-down output control operation, and the selected data pull-down input PD_NORM may be provided to a pull-down shift register 520. Low-level or high-level signals that are stored in the pull-down shift register 520 may be provided to a pull-down control device 320a (or pull-down control elements) of the pull-down driver 320 to adjust an output of the pull-down driver 320.

For example, in the case where "LLLL . . . LHHH" are provided to the registers 520, the pull-down shift register 520 may output pull-down driver output control signals PD_CTRL<0> to PU_CTRL<n> of "LLLL . . . LHHH" to be provided to the pull-down control device 320a. Accordingly, (n–2) pull-up elements 320a-0 to 320a-(N-3) of the pull-down control device 320a to which pull-down driver output control signals of logical low are respectively applied may be turned off, and three pull-up elements 320a-(N-2) to 320a-N of the pull-down control device 320a to which pull-down driver output control signals of logical high are respectively applied may be turned on. The turned-on pull-down elements may operate as a current path for a pull-down operation of the data output circuit 250. The driving capacity of the pull-down driver 320 may increase by increasing the number of high-level signals stored in the shift register 520, that is, by increasing the number of pull-down elements to be turned on. The driving capacity of the pull-down driver 320 may decrease by increasing the number of low-level signals stored in the shift register 520, that is, by increasing the number of pull-down elements to be turned off.

In the case where the pull-down driver output control circuit 220 sets the pull-up driver 320 for the short-circuit test operation, the micro-bump test signal TEST_EN may be set to a second logic level, for example, logical high. The pull-down control selection circuit 510 selects the test pull-down input PD_TEST for the short-circuit test operation, and the selected test pull-down input PD_TEST may be provided to the pull-down shift register 520 of the pull-down driver output control circuit 220. Low-level or high-level signals that are stored in the pull-down shift register 520 may be provided to the pull-down control device 320a (or pull-down elements) of the pull-down driver 320 to adjust an output of the pull-down driver 320.

For example, in the case where "LLLL . . . LLLH" are provided to the pull-down shift register 520, the pull-down shift register 520 may output pull-down driver output control signals PD_CTRL<0> to PU_CTRL<n> of "LLLL . . . LLLH" to be provided to the pull-down control device 320a. Accordingly, n pull-down elements 320a-0 to 320a-(N-1) of the pull-down control device 320a to which pull-down driver output control signals of logical low are respectively applied may be turned off, and one pull-up elements 320a-N of the pull-down control device 320a to which a pull-down driver output control signal of logical high is applied may be turned on. The turned-on pull-down element may operate as a current path for a pull-down operation of the data output circuit 250.

In the case where only one pull-down element is turned on, an output of the pull-up driver 320 may be relatively small. This may be referred to as a "weak-on state". However, example embodiments are not limited thereto. The number of pull-down elements to be turned on for the weak-on state may be variously changed. In other example embodiments, an output of the pull-down driver 310 at the weak-on state may decrease more and more by lowering a current driving capacity, that is, by making a channel length of a weakly turned-on pull-down element greater than that of another pull-down element.

In the case where all pull-down elements of the pull-down control device 320a are turned on, an output of the pull-down driver 320 may be relatively high. This may be referred to as a "strong-on state". However, example embodiments are not limited thereto. The number of pull-down elements to be turned on for the strong-on state may be variously changed.

In the case where all pull-down elements of the pull-down control device 320a are turned off, an output of the pull-down driver 320 may scarcely exist. This may be referred to as an "off state".

The pull-down control device 320a may be implemented with NMOS transistors.

Figure 6:
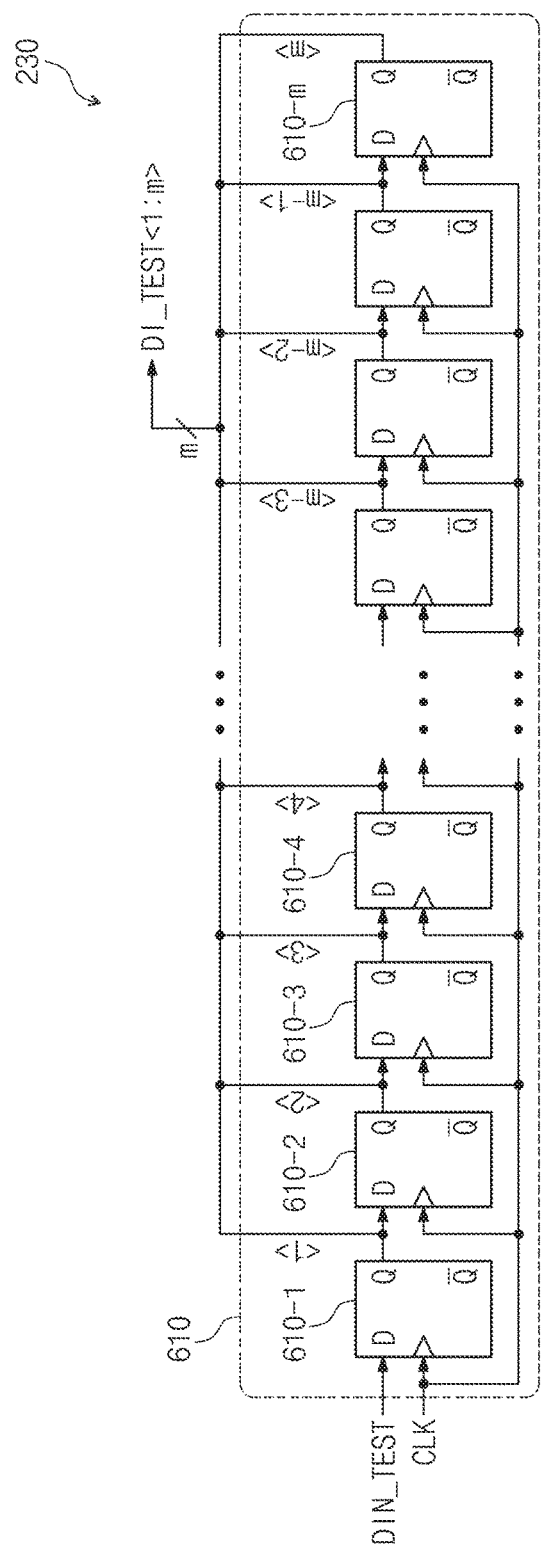
FIG. 6 is a block diagram illustrating a test input data storage circuit according to an example embodiment of the inventive concepts.

FIG. 6 is a block diagram illustrating the test input data storage circuit 230 according to an example embodiment of the inventive concepts.

Referring to FIG. 6, the test input data storage circuit 230 may be implemented with an m-stage input shift register 610. In the m-stage input shift register 610 that receives a test input DIN_TEST sequentially, an input of the input shift register 610 and values stored in registers 610-1 to 610-m may be shifted to next stages every rising transition or falling transition of a clock signal CLK, respectively. "m" indicates the number of micro-bumps to be tested, and registers of the input shift register 610 store test values of micro-bumps respectively corresponding to the registers. An output of the input shift register 610 may be used as test input data DI_TEST<1:m> of the data output circuit connected to a micro-bump to be tested. The case where m test input data DI_TEST<1> to DI_TEST<:m> are completely stored may mean that it is ready to perform the short-circuit test operation with respect to the second semiconductor device 120. In this case, the micro-bump test signal TEST_EN may be set to the second logic level, and thus the test input data. DI_TEST<i> may be sent to the data output circuit 250 corresponding thereto.

Since the test input data storage circuit 230 is implemented with a shift register, only one pin may be used to provide a test input DIN_TEST to a semiconductor device to be tested.

In some example embodiments, if the number of pins of a semiconductor device to be tested is not restricted, registers may be connected to receive test data in parallel, not in series.

Figure 7:
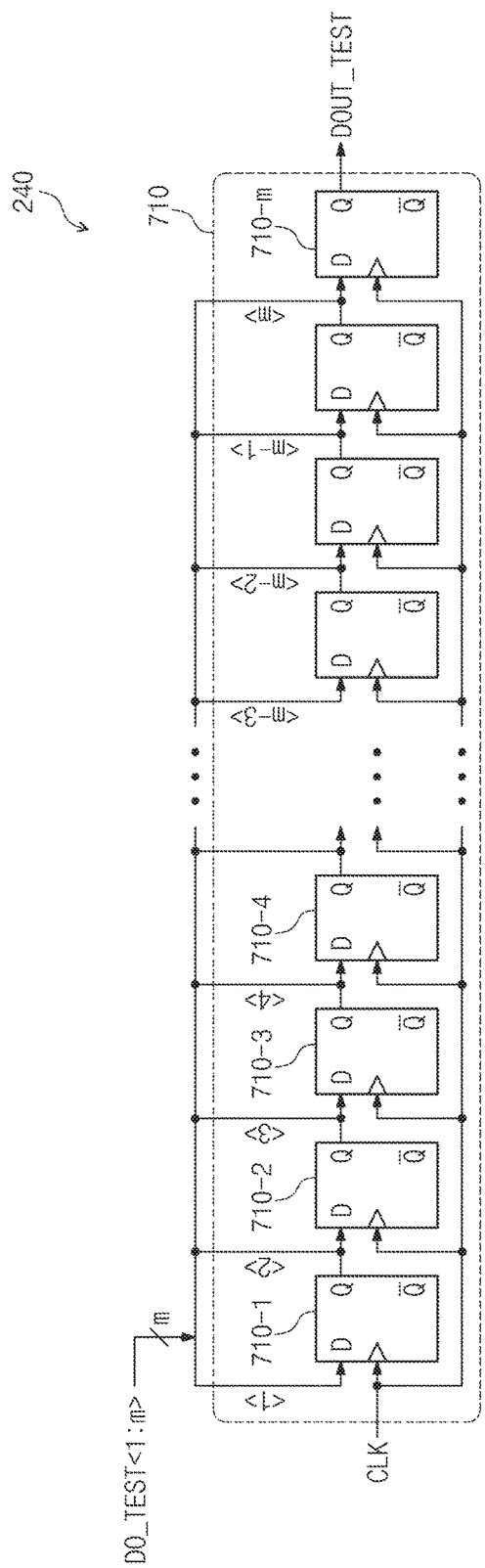
FIG. 7 is a block diagram illustrating a test output data storage circuit according to an example embodiment of the inventive concepts.

FIG. 7 is a block diagram illustrating the test output data storage circuit 240 according to an example embodiment of the inventive concepts.

Referring to FIG. 7, the test output data storage circuit 240 may be implemented with an m-stage shift register and may store test output data DO_TEST<1> to DO_TEST<m> provided from m data output circuits 250 in registers of an output shift register 710, respectively. The test output data DO_TEST<1> to DO_TEST<m> stored in the registers of the output shift register 710 may be shifted sequentially every rising transition of the clock signal CLK, and the output shift register 710 may output a test output DOUT_TEST. "m" indicates the number of micro-bumps to be tested, and registers 710-1 to 710-m of the output shift register 710 may store test values corresponding to micro-bumps, respectively.

Inputs of the registers 710-1 to 710-m of the output shift register 710 may be connected to receive the test output data DO_TEST<1> to DO_TEST<m> of the data output circuits 250 connected with micro-bumps to be tested. The m test output data DO_TEST<1> to DO_TEST<m> may be sequentially output to the data input/output pad (or pin) 205. As output information, the test output DOUT_TEST may be compared with the test input information DIN_TEST to determine whether micro-bumps are electrically connected (or short-circuited). In this case, it may be possible to find locations of short-circuited micro-bumps.

Since the test output data storage circuit 240 is implemented with a shift register, only one pin of a semiconductor device to be tested may be used to output test data DOUT_TEST.

In some example embodiments, if the number of pins of a semiconductor device to be tested is not restricted, registers may be connected to receive test data in parallel, not in series.

In an example embodiment, a data input/output pin for providing a test input DIN_TEST and a data input/output pin for outputting a test output DOUT_TEST may be the same. Accordingly, the number of data input/output pins that are used for such an example embodiment of the inventive concepts may be one.

FIGS. 8A to 8D are drawings for describing an operation of detecting a short circuit between a micro-bump and a ground voltage, according to an example embodiment of the inventive concepts.

Figure 8A:
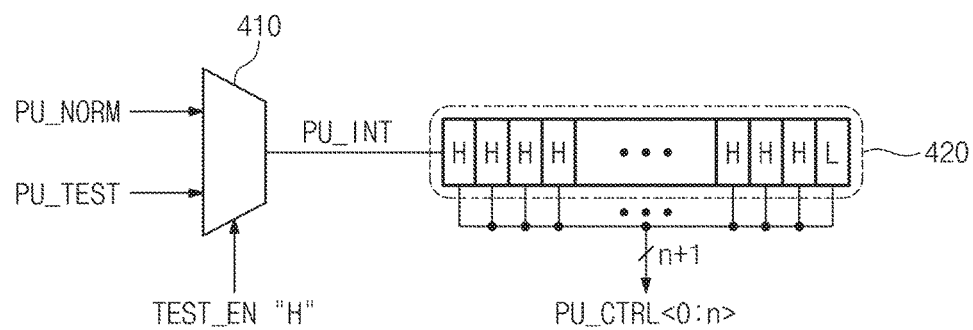
FIG. 8A illustrates an operation of a pull-up output control circuit that is performed to set an output of a pull-up driver to a weak-on state for detecting a short circuit between a micro-bump and a ground voltage.
Figure 8B:
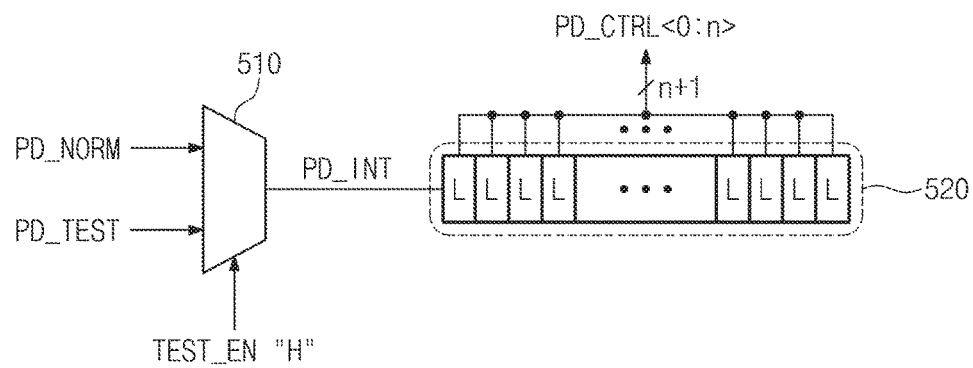
FIG. 8B illustrates an operation of a pull-down output control circuit that is performed to set an output of a pull-down driver to an off state for detecting a short circuit between a micro-bump and a ground voltage.

Referring to FIG. 8A to 8B, to detect a short circuit between a micro-bump and a ground voltage, the pull-up driver 310 and the pull-down driver 320 of each of the data output circuits 250 connected to respective ones of the micro-bumps thereof may be set to a weak-on state and an off state, respectively. In the case where each micro-bump is not electrically to a ground voltage, each micro-bump connected to the data output circuit 250 may have a high value. A micro-bump that is electrically connected to the ground voltage may have a low value.

FIG. 8A illustrates an operation of the pull-up output driver control circuit 210 that is performed to set an output of the pull-up driver 310 to the weak-on state for detecting a short circuit between a micro-bump and the ground voltage.

For descriptive convenience, in FIG. 8A, square boxes indicate registers 420-1 to 420-n of the pull-up shift register 420 of the pull-up driver output control circuit 210, and values in the square boxes indicate logical values stored therein. To set an output of the pull-up driver to a weak-on state, the micro-bump test signal TEST_EN is set by an external device to indicate the short-circuit test operation, and the test pull-up control input PU_TEST provided from the external device is stored in the pull-up shift register 420 of the pull-up driver output control circuit 210.

As illustrated in FIG. 8A, in an example embodiment, "HHHH . . . HHHL" are sequentially stored in the pull-up shift register 420 as the test pull-up control input PU_TEST. The pull-up driver output control circuit 210 outputs pull-up driver output control signals PU_CTRL<0> to PU_CTRL<n> of "HHHH . . . HHHL", and the pull-up driver output control signals PU_CTRL<0> to PU_CTRL<n> are provided to the pull-up control circuit 310a of the pull-up driver 310.

In an example embodiment, a pull-up element 310a-0 to 310a-N may be turned off when logical high is applied thereto and may be turned on when logical low is applied thereto. One pull-up element 310a-N to which logical low is applied is turned on, and the remaining pull-up elements 310a-0 to 310a-(N-1) to each of which logical high is applied is turned on. In this case, an output of the pull-up driver 310 may be set to a weak-on state.

FIG. 8B illustrates an operation of the pull-down driver output control circuit 220 that is performed to set an output of the pull-down driver 320 to the off state for detecting a short circuit between a micro-bump and the ground voltage. For descriptive convenience, in FIG. 8B, square boxes indicate registers 520-1 to 520-n of the pull-down shift register 520 of the pull-down driver output control circuit 220, and values in the square boxes indicate logical values stored therein. To set an output of the pull-up driver to the off state, the micro-bump test signal TEST_EN is set by an external device to indicate the short-circuit test operation, and the test pull-down control input PD_TEST provided from the external device is stored in the pull-down shift register 520 of the pull-down driver output control circuit 220.

In an example embodiment, "LLLL . . . LLLL" are sequentially stored in the pull-down shift register 520 as the test pull-down control input PU_TEST. The pull-down driver output control circuit 220 outputs pull-down driver output control signals PD_CTRL<0> to PD_CTRL<n> of "LLLL . . . LLLL", and the pull-down driver output control signals PD_CTRL<0> to PD_CTRL<n> are provided to the pull-down control device 320a of the pull-down driver 320. In an example embodiment, a pull-down element 320a-0 to 320a-N is turned on when logical high is applied thereto and is turned off when logical low is applied thereto. In an example embodiment, since logical low is applied to all pull-down elements of the pull-down control device 320a, all the pull-down elements are turned off. In this case, an output of the pull-down driver 320 is set to the off state.

Figure 8C:
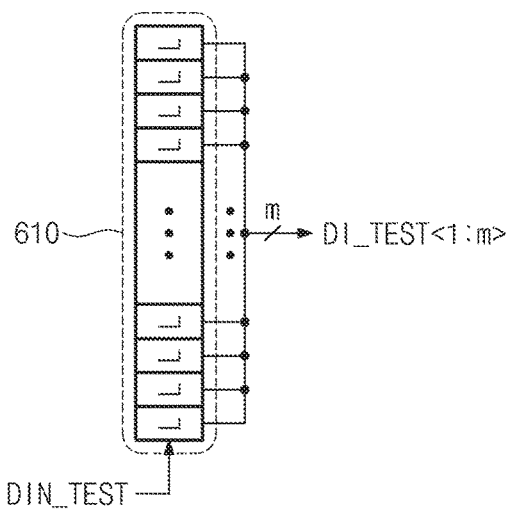
FIG. 8C illustrates an operation of storing a test input for detecting a short circuit between a micro-bump and a ground voltage in a test input data storage circuit.

FIG. 8C illustrates an operation of storing a test input DIN_TEST for detecting a short circuit between a micro-bump and a ground voltage in the test input data storage circuit 230. Logical low of a test input DIN_TEST is provided to detect a short circuit between a micro-bump and a ground voltage. Accordingly, "LLLL . . . LLLL" are sequentially received as the test input DIN_TEST.

For descriptive convenience, in FIG. 8C, square boxes indicate registers 610-1 to 610-m of the input shift register 610 of the test input data storage circuit 230, and values in the square boxes indicate logical values stored therein.

In an example embodiment, since "LLLL . . . LLLL" are sequentially received as the test input DIN_TEST, the test input data storage circuit 230 stores test input data DI_TEST <1> to DI_TEST<m> of "LLLL . . . LLLL". If the micro-bump test signal TEST_EN is set by the external device to indicate the short-circuit test operation, test input data DI_TEST <1> to DI_TEST<m> of "LLLL . . . LLLL" are supplied as inputs of the pull-up drive device 310b and the pull-down drive device 320b of the data output circuit 250. Since all pull-down elements 320a-0 to 320a-N of the pull-down control device 320a are turned off, no pull-down current path exists. Since an n-th pull-up element 310b-N connected in series to a turned-on pull-down element, for example, an n-th pull-up element 310a-N is turned on, the data output circuit 250 outputs logical high. Accordingly, each data output circuit 250 outputs signals DOUT<0> to DOUT<m> of logic high, and test output data DO_TEST<0> to DO_TEST<m> of logical low are stored in the test output data storage circuit 240 through an inverter. That is, in the case where no micro-bump is short circuited, a value of "LLLL . . . LLLL" is stored in the test output data storage circuit 240.

The test output data DO_TEST<0> to DO_TEST<m> stored in the test output data storage circuit 240 are sequentially output to the test apparatus through the data input/output pad 205. The test apparatus may detect a short circuit between a micro-bump and a ground voltage, by comparing the test input data DOUT_TEST with each value of the test output data DOUT_TEST.

When the test input DIN_TEST of "LLLL . . . LLLL" is the same as the test output data DOUT_TEST of "LLLL . . . LLLL", there is determined that a micro-bump is not grounded.

Figure 8D:
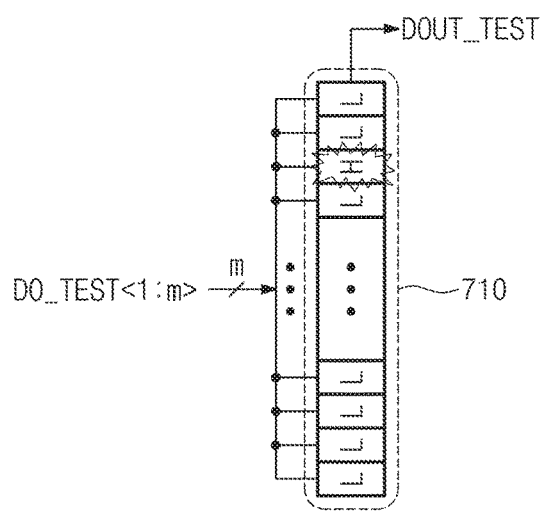
FIG. 8D is a drawing for describing the case that a short circuit is generated between a micro-bump and a ground voltage.

FIG. 8D is a drawing for describing the case that a short circuit is generated between a micro-bump and a ground voltage.

In FIG. 8D, when an (m-2)-th micro-bump is connected with a ground voltage, an (m-2)-th micro-bump may have a ground voltage level. Accordingly, even though the data input/output pad 205 is driven with logical high by an output value DOUT<1> of the data output circuit 250 connected to the (m-2)-th micro-bump at a weak-on state, an output may be relatively low. In the case where a micro-bump is electrically connected with a ground voltage (or a short circuit is generated), a logic level of the micro-bump may be determined to be short circuited. In this case, the data input/output pad 205 connected to the (m-2)-th micro-bump has logical low, and thus the test output data signal DO_TEST<m-2> provided to the test output data storage circuit 240 becomes high. This may mean that logical high is stored in an (m-2)-th register 710-(m-2) of the output shift register 710 in the test output data storage circuit 240. Afterwards, in the case where a value stored in the test output data storage circuit 240 is output as the test output data. DOUT_TEST, the test output data DOUT_TEST of "LLLL . . . LHLL" in which an (m-2)-th value is logical high may be output. In other words, since an (m-2)-th value of the test output data DOUT_TEST is different from that of the test input data DIN_TEST, there is determined that an i-th micro-bump is electrically connected with a ground voltage.

An example embodiment is described in which one of micro-bumps is short-circuited with a ground voltage. However, example embodiments of the inventive concepts are not limited thereto. For example, a case in which multiple ones of micro-bumps are short-circuited with a ground voltage may be also detected in the same manner as described above.

FIG. 9A to 9D are drawings for describing a short circuit detecting operation when a micro-bump is short-circuited with a power supply voltage VDD, according to an example embodiment of the inventive concepts.

Referring to FIGS. 9A to 9D, to detect a short circuit between a micro-bump and a the power supply voltage VDD, the pull-down driver 320 and the pull-up driver 310 of each of the data output circuits 250 connected to respective ones of the micro-bumps thereof may be set to a weak-on state and an off state, respectively. In the case where each micro-bump is not electrically to the power supply voltage VDD, each micro-bump connected to the data output circuit 250 may have a low value. A micro-bump that is electrically connected to the power supply voltage VDD may have a high value.

Figure 9A:
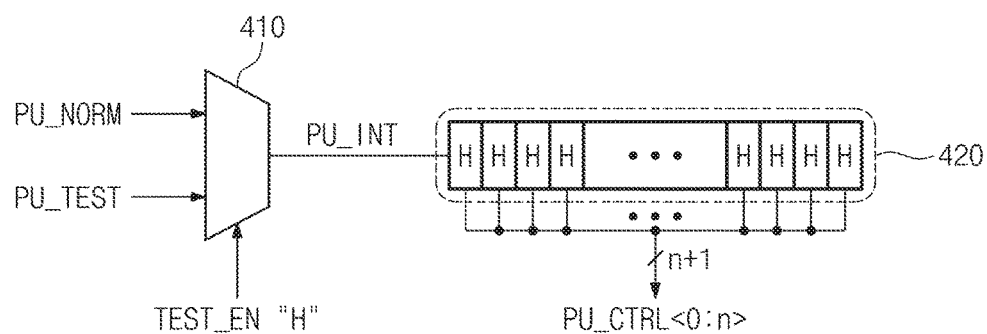
FIG. 9A illustrates an operation of a pull-up output control circuit that is performed to set an output of a pull-up driver to an off state for detecting a short circuit between a micro-bump and a supply voltage.

FIG. 9A illustrates an operation of the pull-up driver output control circuit 210 that is performed to set an output of the pull-up driver 310 to the off state for detecting a short circuit between a micro-bump and the power supply voltage VDD. For descriptive convenience, in FIG. 9A, square boxes indicate registers 420-1 to 420-n of the pull-up shift register 420 of the pull-up driver output control circuit 210, and values in the square boxes indicate logical values stored therein.

In an example embodiment, "HHHH . . . HHHH" are sequentially stored in the pull-up shift register 420 as the test pull-up control input PU_TEST. The pull-up driver output control circuit 210 outputs pull-up driver output control signals PU_CTRL<0> to PU_CTRL<n> of "HHHH . . .

HHHH", and the pull-up driver output control signals PU_CTRL<0> to PU_CTRL<n> are provided to the pull-up control circuit 310a of the pull-up driver 310. Since all pull-up elements of the pull-up control circuit 310a are turned off, an output of the pull-up driver 310 is set to the off state.

Figure 9B:
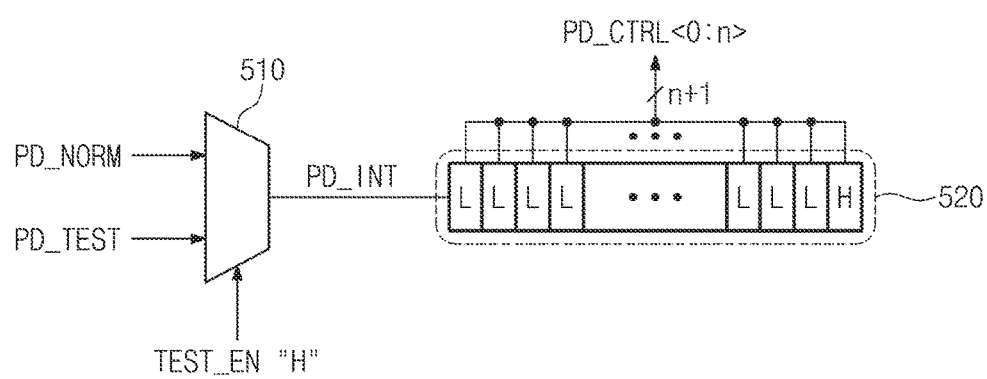
FIG. 9B illustrates an operation of a pull-down output control circuit that is performed to set an output of a pull-down driver to a weak-on state for detecting a short circuit between a micro-bump and a supply voltage.

FIG. 9B illustrates an operation of the pull-down driver output control circuit 220 that is performed to set an output of the pull-down driver 320 to the weak-on state for detecting a short circuit between a micro-bump and the power supply voltage VDD. For descriptive convenience, in FIG. 9B, square boxes indicate registers 520-1 to 520-n of the pull-down shift register 520 of the pull-down driver output control circuit 220, and values in the square boxes indicate logical values stored therein. In an embodiment, to set an output of the pull-down driver 320 to the weak-on state, "LLLL . . . LLLH" are sequentially stored in the pull-down shift register 520 as the test pull-down control input PD_TEST. The pull-down driver output control circuit 220 outputs pull-down driver output control signals PD_CTRL<0> to PD_CTRL<n> of "LLLL . . . LLLH", and the pull-down driver output control signals PD_CTRL<0> to PD_CTRL<n> are provided to the pull-down control device 320a of the pull-down driver 320. In an example embodiment, "H" is applied to one pull-down element 320a-N, and "L" is applied to the remaining pull-down elements. In this case, since only one pull-down element 320a-N is turned on, an output of the pull-down driver 320 is set to the weak-on state.

Figure 9C:
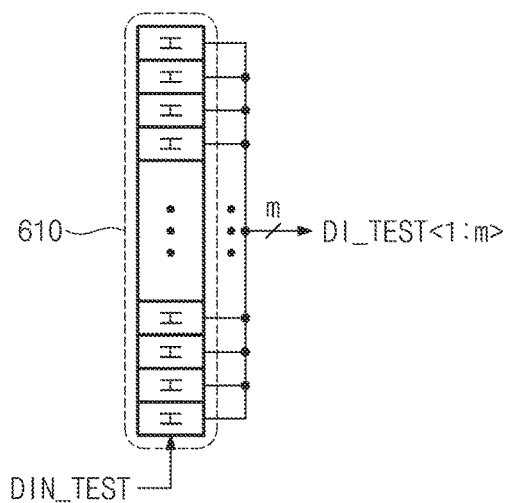
FIG. 9C illustrates an operation of storing a test input for detecting a short circuit between a micro-bump and a supply voltage in a test input data storage circuit.

FIG. 9C illustrates an operation of storing a test input DIN_TEST for detecting a short circuit between a micro-bump and a power supply voltage VDD in the test input data storage circuit 230. Logical high of a test input DIN_TEST is provided to detect a short circuit between a micro-bump and the power supply voltage VDD. Accordingly, "HHHH . . . HHHH" are sequentially received as the test input DIN_TEST.

In an embodiment, since "HHHH . . . HHHH" are sequentially received as the test input DIN_TEST, the test input data storage circuit 230 stores "HHHH . . . HHHH" as test input data DI_TEST<i> to DI_TEST<m>. In this case, "HHHH . . . HHHH", that is, the test input data DI_TEST<i> to DI_TEST<m> are provided as inputs of the pull-up drive circuit 310b and the pull-down drive circuit 320b of the data output circuit 250. Since all pull-up elements of the pull-up drive circuit 310b are turned off, no pull-up current path exists. Since an n-th pull-down element 320b-N connected in series to a turned-on pull-down element, for example, an n-th pull-down element 320a-N is turned on, the data output circuit 250 outputs logical low. Accordingly, each of the data output circuits 250 outputs a signal DOUT<n> of logic low, and a signal DO_TEST<n> of logical high is stored in the test output data storage circuit 240 through an inverter. That is, in the case where no micro-bump is short-circuited, a value of "HHHH . . . HHHH" is stored in the test output data storage circuit 240.

The test output data values DO_TEST<0> to DO_TEST<m> stored in the test output data storage circuit 240 are sequentially output to the test apparatus through the data input/output pad 205. The test apparatus may detect a short circuit between a micro-bump and the power supply voltage VDD, by comparing the test input data DOUT_TEST with each value of the test output data DOUT_TEST. As described with reference to FIG. 9C, when the test input data DIN_TEST of "HHHH . . . HHHH" is the same as the test output data DOUT_TEST of "HHHH . . . HHHH", there is determined that a micro-bump is not electrically connected with the power supply voltage VDD.

Figure 9D:
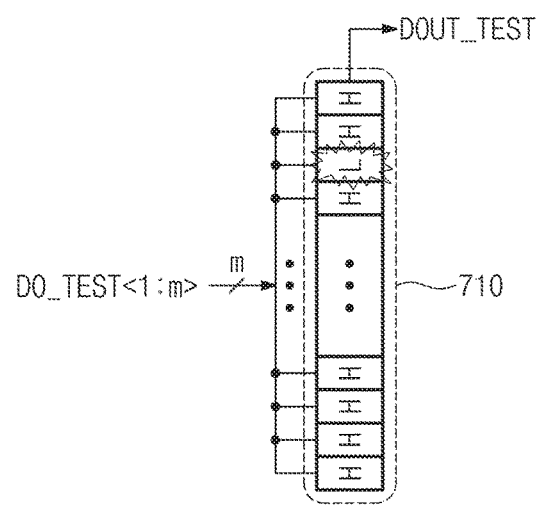
FIG. 9D is a drawing for describing the case that a short circuit is generated between a micro-bump and a supply voltage.

FIG. 9D is a drawing for describing the case that a short circuit is generated between a micro-bump and a power supply voltage VDD.

Referring to FIG. 9D, when an (m-2)-th micro-bump is connected with the power supply voltage VDD, an (m-2)-th micro-bump may have a level of the power supply voltage VDD. Accordingly, even though the data input/output pad 205 is driven with logical low by an output value DOUT<m-2> of the data output circuit 250 connected to the (m-2)-th micro-bump at a weak-on state, an output may be relatively low. For this reason, the level of the power supply voltage VDD of the micro-bump may not be changed. In this case, the data input/output pad 205 connected to the (m-2)-th micro-bump has logical high, and thus the test output data signal DO_TEST<m-2> provided to the test output data storage circuit 240 becomes low. This may mean that logical low is stored in an (m-2)-th register 710-(m-2) of the output shift register 710 in the test output data storage circuit 240. Afterwards, in the case where a value stored in the test output data storage circuit 240 is output as the test output data DOUT_TEST, the test output data. DOUT_TEST of "HHHH . . . HLHH" in which an (m-2)-th value is logical low may be output. In other words, since an (m-2)-th value of the test output data DOUT_TEST is different from that of the test input data DIN_TEST, the test apparatus may determine that an (m-2)-th micro-bump is electrically connected with the power supply voltage VDD.

An example embodiment is described as one of micro-bumps is short-circuited with the power supply voltage VDD. However, example embodiments of the inventive concepts are not limited thereto. For example, the case that multiple micro-bumps are short-circuited with the power supply voltage VDD may be also detected in the same manner as described above.

FIGS. 10A to 10G are drawings for describing an operation of detecting a short circuit between adjacent micro-bumps, according to an example embodiment of the inventive concepts.

Referring to FIGS. 10A to 10G, a micro-bump that is a target to be tested to detect a short circuit may be referred to as a "victim", and a micro-bump that causes a short circuit to the victim may be referred to as an "aggressor".

In an example embodiment, an output of the data output circuit 250 connected to the victim may be set to a weak-on state so as to be driven with logical low, and an output of the data output circuit 250 connected to the aggressor may be set to a strong-on state so as to be driven with logical high. When the victim and the aggressor are not short-circuited, a test output DOUT_TEST output through a data output circuit may be the same as a test input DIN_TEST provided to the victim. In contrast, when the victim and the aggressor are short-circuited, the test output DOUT_TEST output through the data output circuit and the test input DIN_TEST provided to the victim may have different values at a location of a short-circuited victim. For example, when an i-th victim and a j-th aggressor are short-circuited, an i-th test input DIN_TEST may be different from an i-th test output DOUT_TEST.

It may be possible to determine whether each micro-bump is short-circuited with an adjacent micro-bump, by exchanging and testing a victim and an aggressor.

Figure 10A:
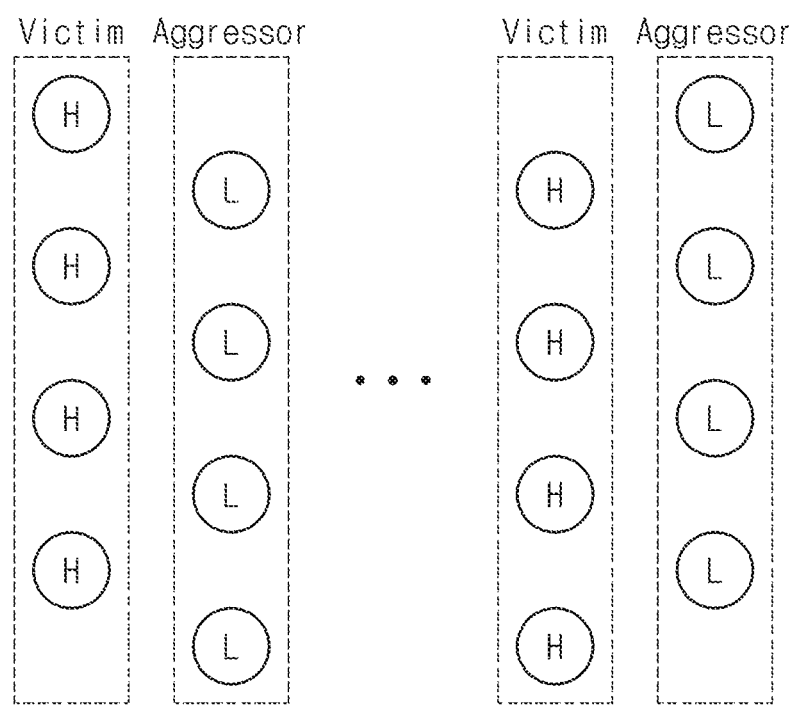
FIG. 10A is a drawing illustrating an arrangement of victims and aggressors for deter of a short circuit between adjacent micro-bumps.

FIG. 10A illustrates an arrangement of victims and aggressors. Victims and aggressors are arranged to be adjacent to each other, an output of the data output circuit 250 connected to the victim may be set to a strong-on state so as to be driven with logical high, and an output of the data output circuit 250 connected to the aggressor may be set to a weak-on state so as to be driven with logical low.

For descriptive convenience, a data value to be driven is marked grayly in a victim that the data output circuit 250 drives at a weak-on state, and a data value to be driven is marked by a solid line in an aggressor that the data output circuit 250 drives at a strong-on state.

An example embodiment is illustrated in FIG. 10A as columns of victims and columns of aggressors are arranged to be adjacent to each other. However, example embodiments are not limited thereto. For example, whether micro-bumps adjacent to each other in various shapes are short-circuited may be determined by changing the arrangement of victims and aggressors variously.

Figure 10B:
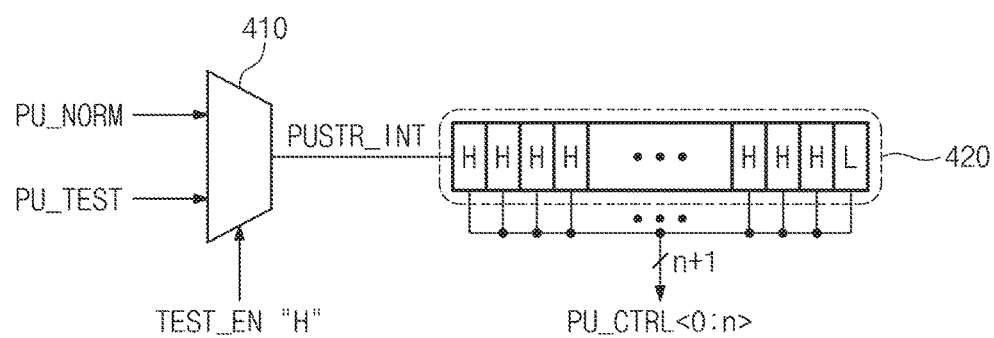
FIG. 10B illustrates an operation of a pull-up output control circuit that is performed to set an output of a pull-up driver, which is connected to a victim, to a weak-on state for detecting a short circuit between adjacent micro-bumps.

FIG. 10B illustrates an operation of the pull-up driver output control circuit 210 that is performed to set an output of the pull-up driver 310, which is connected to the victim, to the weak-on state for detecting a short circuit between adjacent micro-bumps.

Referring to FIG. 10B, in an example embodiment, "HHHH . . . HHHL" are sequentially received as the test pull-up control input PU_TEST. In this case, a pull-up element 310a-N may be turned on when logical low is applied thereto, and the remaining pull-up elements 310a-0 to 310a-(N-1) may be turned off. In this case, an output of the pull-up driver 310 may be set to a weak-on state.

Figure 10C:
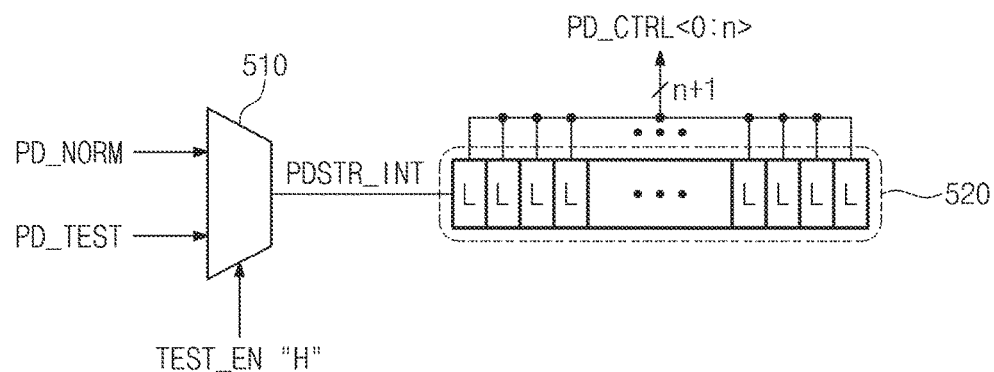
FIG. 10C illustrates an operation of a pull-down output control circuit that is performed to set an output of a pull-down driver, which is connected to a victim, to an off state for detecting a short circuit between adjacent micro-bumps.

FIG. 10C, illustrates an operation of the pull-up driver output control circuit 220 that is performed to set an output of the pull-down driver 320, which is connected to the victim, to the off state for detecting a short circuit between adjacent micro-bumps.

Referring to FIG. 10C, in an example embodiment, to set an output of the pull-down driver 320 to the off state, "LLLL . . . LLLL" are sequentially stored in the pull-down shift register 520 as the test pull-down control input PD_TEST. Since logical low is applied to all pull-down elements of the pull-down control device 320a, all the pull-down elements are turned off. In this case, an output of the pull-down driver 310 is set to the off state.

Figure 10D:
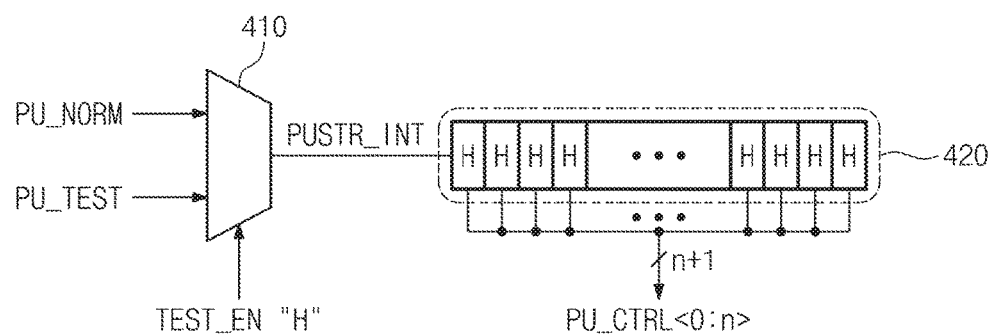
FIG. 10D illustrates an operation of a pull-up output control circuit that is performed to set an output of a pull-up driver of a data output circuit, which is connected to an aggressor, to an off state for detecting a short circuit between adjacent micro-bumps.

FIG. 10D illustrates an operation of the pull-up driver output control circuit 210 that is performed to set an output of the pull-up driver 310 of the data output circuit 250, which is connected to the aggressor, to the off state for detecting a short circuit between adjacent micro-bumps.

Referring to FIG. 10D, in an example embodiment, "HHHH . . . HHHH" are sequentially stored in the pull-up shift register 420 as the test pull-up control input PU_TEST. Since "HHHH . . . HHHH" are applied to pull-up elements of the pull-up control circuit 310a, an output of the pull-up driver 310 may be set to the off state.

Figure 10E:
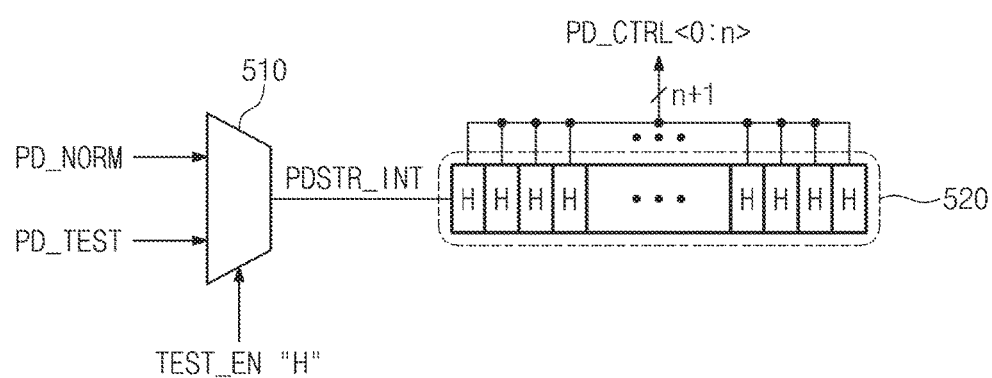
FIG. 10E illustrates an operation of a pull-down output control circuit that is performed to set an output of a pull-down driver, which is connected to an aggressor, to a strong-on state for detecting a short circuit between adjacent micro-bumps.

FIG. 10E illustrates an operation of the pull-down driver output control circuit 220 that is performed to set an output of the pull-down driver 320, which is connected to the aggressor, to the strong-on state for detecting a short circuit between adjacent micro-bumps.

Referring to FIG. 10E, in an example embodiment, "HHHH . . . HHHH" are sequentially stored in the pull-down shift register 520 as the test pull-down control input PD_TEST. Since all pull-down elements of the pull-down control device 320a in the pull-down driver 320 are turned on, an output of the data output circuit 250 may be set to the strong-on state.

Figure 10F:
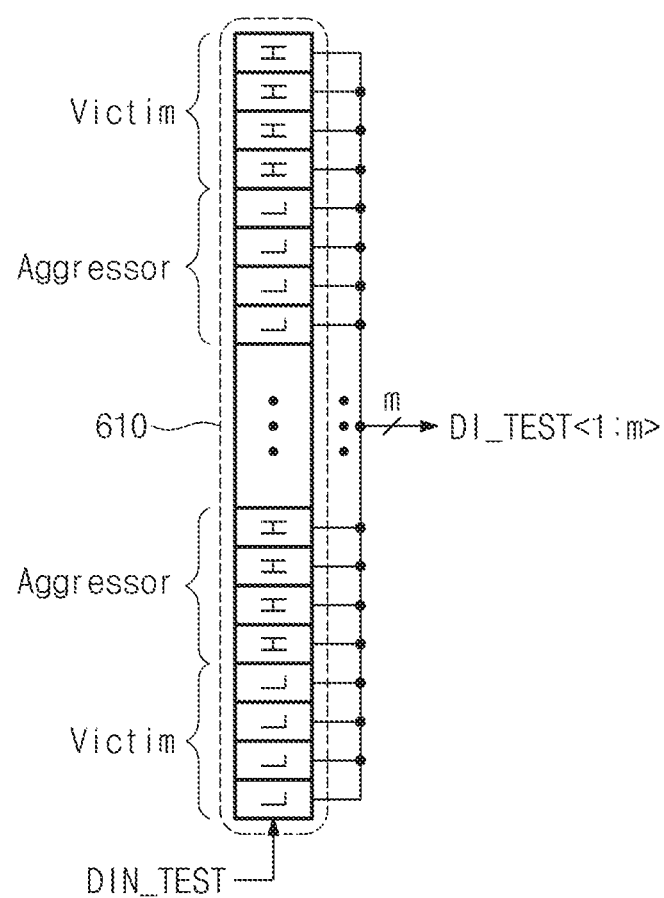
FIG. 10F is a drawing illustrating a test input storage operation for detecting a short circuit between adjacent micro-bumps.

FIG. 10F is a drawing illustrating a test input storage operation for detecting a short circuit between adjacent micro-bumps.

Referring to FIG. 10F, the test input data storage circuit 230 stores a test input DIN_TEST for detecting a short circuit between adjacent micro-bumps. A test input DIN_TEST provided to a victim that is a micro-bump corresponding to a target to be tested for a short circuit may be different from a test input DIN_TEST provided to an aggressor that is a micro-bump causing a short circuit to the victim. For example, in 4-by-m/4 micro-bump array structure, victims and aggressors are alternately arranged for respective columns, and the test input DIN_TEST is sequentially provided for each column. Also, in the case where a test output DOUT_TEST is output, the victim may be weakly driven with logical high, and the aggressor may be strongly driven with logical low. Accordingly, "LLLLH-HHH . . . LLLLHHHH" are sequentially received as the test input DIN_TEST.

The test input data storage circuit 230 stores test input data DI_TEST, that is, "LLLLHHHH . . . LLLLHHHH" in an input shift register and provides the test input data DI_TEST, that is, "LLLLHHHH . . . LLLLHHHH" to inputs of the pull-up drive circuit 310b and the pull-down drive circuit 320b of the data output circuit 250. Since all pull-down elements of the pull-down control circuit 320a of the victim are turned off and an n-th pull-up element 310a-N of the pull-up control circuit 310a is turned on, the data output circuit 250 drives logical high of test input data weakly. Since all pull-down elements of the pull-down control circuit 320a of the aggressor are turned on, the data output circuit 250 drives logical low of test input data strongly.

In the case where the victim and the aggressor are not electrically connected, the same value as the test input DIN_TEST, that is, "LLLLHHHH . . . LLLLHHHH" are stored in the test output data storage circuit 240 and then are sequentially output as the test output DOUT_TEST.

Since the test input DIN_TEST is the same as the test output DOUT_TEST, the test apparatus determines that the victim and the aggressor are not electrically connected.

Figure 10G:
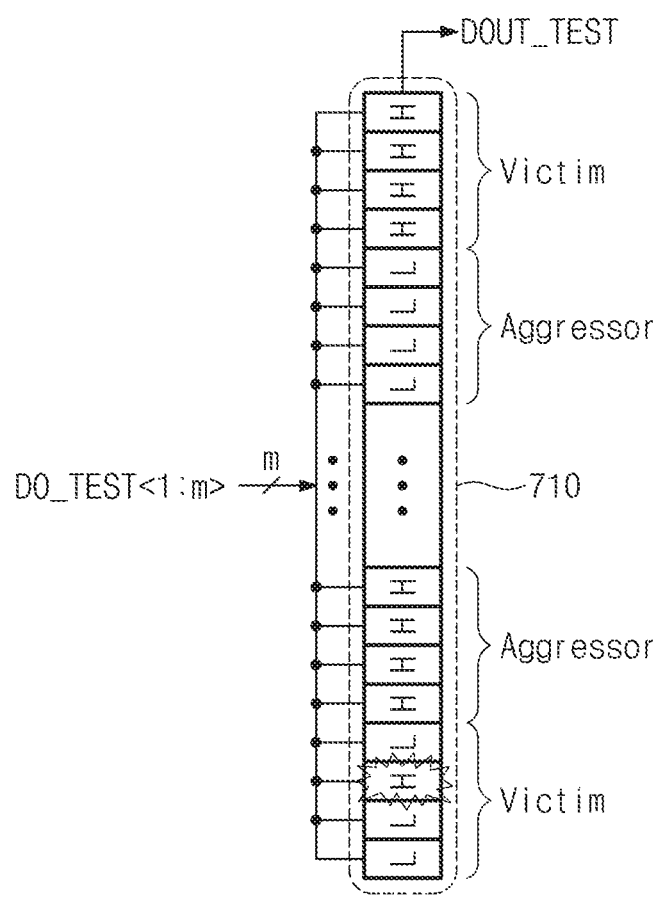
FIG. 10G is a drawing illustrating data stored in a test data output storage circuit when adjacent micro-bumps are electrically connected to each other.

FIG. 10G is a drawing illustrating data stored in the test output data storage circuit 240 when adjacent micro-bumps are electrically connected to each other.

Referring to FIG. 10G, in an example embodiment, even though "LLLLHHHH . . . LLLLHHHH" are input as the test input DIN_TEST, "LLHLHHHH . . . LLLLHHHH" are output as the test output DOUT_TEST. Accordingly, that a short circuit is generated at a victim at the third row and first column is determined. In the case where the victim at the third row and first column is electrically connected with an aggressor strongly driven with logical low while the data output circuit 250 drives logical high weakly, a logic level of the victim is "L", and logical high is stored in the test output data storage circuit 240 through an inverter.

An example embodiment is illustrated in FIG. 10 as a short circuit detecting operation is performed while a victim is weakly driven with logical high and an aggressor is strongly driven with logical low. However, example embodiments are not limited thereto. For example, the short circuit detecting operation may be performed while a victim is weakly driven with logical low and an aggressor is strongly driven with logical high. To drive a victim weakly with logical low and an aggressor strongly with logical high, the pull-up driver 310 of the victim is set to an off state, and the pull-down driver 320 thereof is set to a weak-on state. Also, a logic level of the test input DIN_TEST of the victor is set to "H", and a logic level of the test input DIN_TEST of the aggressor is set to "L".

Figure 11:
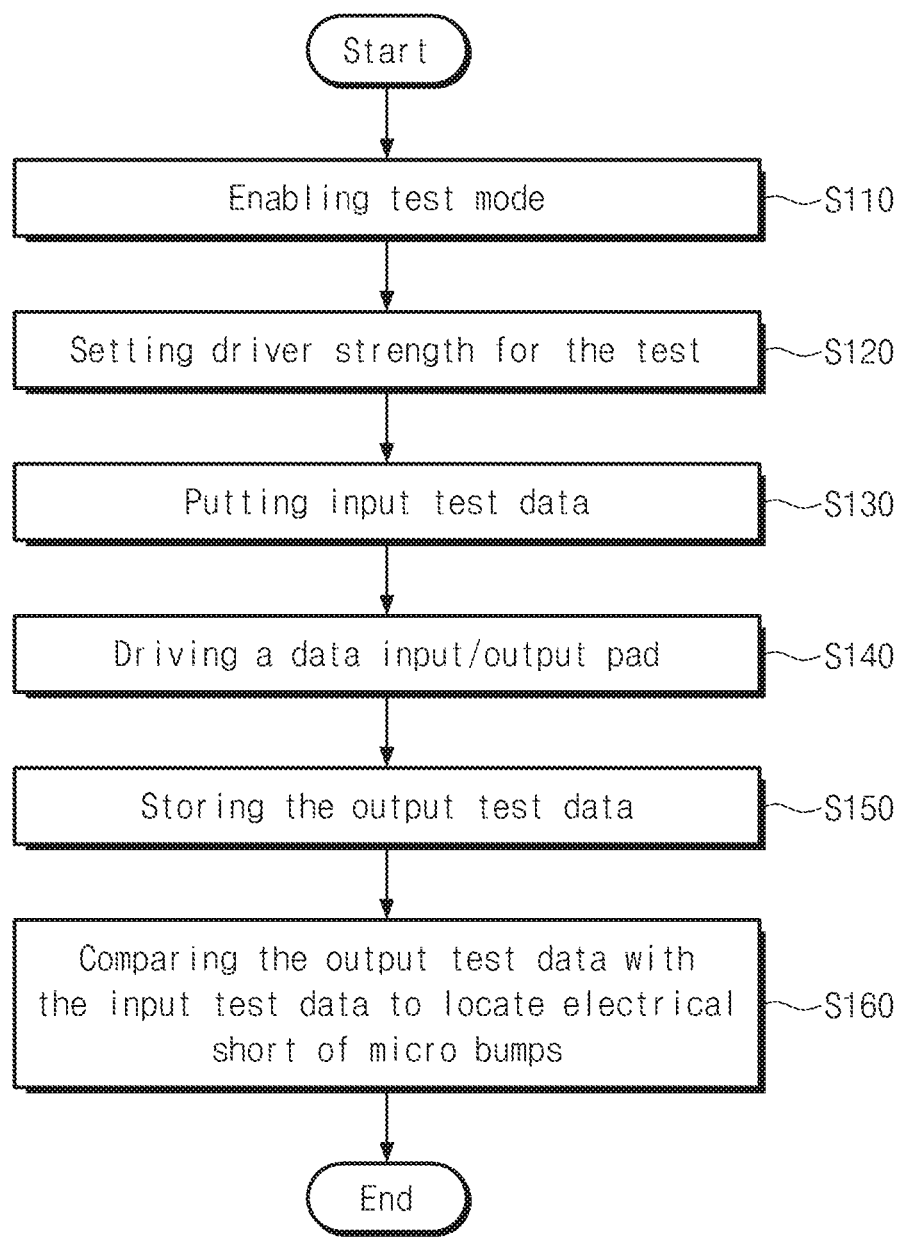
FIG. 11 is a flowchart illustrating a short circuit detecting method according to an example embodiment of the inventive concepts.

FIG. 11 is a flowchart illustrating a short circuit detecting method according to an example embodiment of the inventive concepts.

Referring to FIG. 11, in operation S110, a micro-bump short circuit test signal may be supplied to a semiconductor chip including a plurality of micro-bumps.

In operation S120, the pull-up driver output control circuit 210 and the pull-down driver output control circuit 220 may set outputs of a pull-up driver and a pull-down driver, respectively, of each data output circuit to one of an off state, a weak-on state, and a strong-on state based on a micro-bump short circuit test type.

In operation S130, the test input data storage circuit 230 may store test input data.

In operation S140, the pull-up driver 310 and the pull-down driver 320 may drive the data output circuit 250.

In operation S150, the test output data storage circuit 240 may store an output of the data output circuit 250.

In operation S160, the test output data storage circuit 240 may output test output data.

In operation S170, a test apparatus may detect a micro-bump short circuit by based on the test input data and the test output data. For example, the test apparatus may compare the test input data and the test output data A micro-bump short circuit detecting circuit and method of a stacked semiconductor memory chip according to an example embodiment of the inventive concepts may detect a short circuit between each micro-bump and a ground voltage, between each micro-bump and a supply voltage, and/or between adjacent micro-bumps.

That is, whether a short circuit is generated at a micro-bump and a location of the micro-bump may be determined by setting outputs of a pull-up driver 310 and a pull-down driver 320 of a data output circuit 250 in a memory chip connected with a micro-bump according to a test type, providing test input data to the memory chip, and determining whether test output data is the same as the test input data.

According to example embodiments of the inventive concepts, in the stacked semiconductor memory chip, it may be possible to detect a bad product due to a short circuit between adjacent micro-bumps. Accordingly, productivity and reliability of a semiconductor package may be improved.

While example embodiments of the inventive s have been described with reference to some example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. A short circuit detecting circuit comprising:
a plurality of data input/output pads each connected to respective ones of a plurality of micro-bumps;
a plurality of data output circuits each including a pull-up driver and a pull-down driver, the plurality of data output circuits each configured to drive respective ones of the plurality of data input/output pads;
a pull-up driver output control circuit configured to select, for each of the plurality of data output circuits, one of an off state, a weak-on state, and a strong-on state as an output of the pull-up driver associated therewith based on a micro-bump short circuit test type;
a pull-down driver output control circuit configured to select, for each of the plurality of data output circuits, one of the off state, the weak-on state, and the strong-on state as an output of the pull-down driver associated therewith based on the micro-bump short circuit test type;
a test input data storage circuit; and
a test output data storage circuit.

2. The short circuit detecting circuit of claim 1, wherein the micro-bump short circuit test type comprises at least one of (i) an operation of testing a short circuit between one of the plurality of micro-bumps and a ground voltage, (ii) an operation of testing a short circuit between one of the plurality of micro-bumps and a power supply voltage, and (iii) an operation of testing a short circuit between adjacent ones of the plurality of micro-bumps.

3. The short circuit detecting circuit of claim 2, wherein if the micro-bump short circuit test type is the operation of testing the short circuit between the one of the plurality of micro-bumps and the ground voltage, the pull-up driver output control circuit is configured to set an output of the pull-up driver of each of the plurality of data output circuits to the weak-on state, and the pull-down driver output control circuit is configured to set the output of the pull-down driver of each of the plurality of data output circuits to the off state.

4. The short circuit detecting circuit of claim 2, wherein if the micro-bump short circuit test type is the operation of testing the short circuit between the one of the micro-bumps and the power supply voltage, the pull-up driver output control circuit is configured to set an output of the pull-up driver of each of the plurality of data output circuits to the off state, and the pull-down driver output control circuit is configured to set an output of the pull-down driver of each of the plurality of data output circuits to the weak-on state.

5. The short circuit detecting circuit of claim 2, wherein if the micro-bump short circuit test type is the operation of testing the short circuit between the adjacent ones of the plurality of micro-bumps,
the pull-up driver output control circuit is configured to,
set an output of the pull-up driver connected to a micro-bump corresponding to a short circuit test target to the weak-on state, and
set an output of the pull-up driver connected to a micro-bump adjacent to the micro-bump corresponding to the short circuit test target to the off state; and
the pull-down driver output control circuit is configured to,
set an output of the pull-down driver connected to the micro-bump corresponding to the short circuit test target to the off state,
set an output of the pull-down driver connected to the micro-bump adjacent to the micro-bump corresponding to the short circuit test target to the strong-on state.

6. The short circuit detecting circuit of claim 2, wherein if the micro-bump short circuit test type is the operation of testing the short circuit between the adjacent micro-bumps,
the pull-up driver output control circuit is configured to,
set an output of the pull-up driver connected to a micro-bump corresponding to a short circuit test target to the off state, and
set an output of the pull-up driver connected to a micro-bump adjacent to the micro-bump corresponding to the short circuit test target to the strong-on state; and
the pull-down driver output control circuit is configured to,
set an output of the pull-down driver connected to the micro-bump corresponding to the short circuit test target to the weak-on state, and set an output of the pull-down driver connected to the micro-bump adjacent to the micro-bump corresponding to the short circuit test target to the weak-on state.

7. The short circuit detecting circuit of claim 1, wherein the pull-up driver output control circuit is configured to,
set an output of each of the pull-up drivers such that the plurality of data output circuits perform a normal data output operation in a first operation mode, and
set an output of each of the pull-up drivers such that the plurality of the data output circuits perform a micro-bump short circuit test operation in a second operation mode.

8. The short circuit detecting circuit of claim 7, wherein the second operation mode is a mode register set (MRS) operation.

9. The short circuit detecting circuit of claim 7, wherein the pull-up driver output control circuit is configured to generate a plurality of pull-up output control signals to set outputs of respective ones of the pull-up drivers.

10. The short circuit detecting circuit of claim 1, wherein the pull-down driver output control circuit is configured to,
set an output of the pull-down drivers such that the plurality of data output circuits perform a normal data output operation in a first operation mode, and
set an output of the pull-down drivers such that the plurality of data output circuits perform a micro-bump short circuit test operation in a second operation mode.

11. The short circuit detecting circuit of claim 10, wherein the second operation mode is a mode register set (MRS) operation.

12. The short circuit detecting circuit of claim 10, wherein the pull-down driver output control circuit generates a plurality of pull-down output control signals to set outputs of respective ones of the pull-down drivers.

13. The short circuit detecting circuit of claim 1, wherein each of the pull-up drivers comprise:
a plurality of pull-up elements, the plurality of pull-up elements configured to turn off or on based on pull-up output control signals from the pull-up driver output control circuit.

14. The short circuit detecting circuit of claim 1, wherein each of the pull-down drivers comprise:
a plurality of pull-down elements configured to turn off or on based on pull-down output control signals from the pull-down driver output control circuit.

15. The short circuit detecting circuit of claim 1, wherein the test input data storage circuit comprises:
an m-stage shift register including m registers connected in series, where "m" is a number of the plurality of micro-bumps of a semiconductor chip to be tested to detect a micro-bump short circuit.

16. The short circuit detecting circuit of claim 15, wherein the test input data storage circuit is configured to,
sequentially receive test input data to a first register of the m-stage shift register during m clock cycles, and
shift the test input data stored in the first register into a next register of the m-stage shift register every rising transition of a clock signal.

17. The short circuit detecting circuit of claim 15, wherein the plurality of data output circuits are each configured to receive an output of a corresponding register of the m-stage shift register.

18. The short circuit detecting circuit of claim 1, wherein the test output data storage circuit comprises:
an m-stage shift register including m registers connected in series, where "m" is a number of the plurality of micro-bumps of a semiconductor chip to be tested to detect a micro-bump short circuit.

19. The short circuit detecting circuit of claim 18, wherein the test output data storage circuit is configured to,
sequentially output test output data to an m-th register of the m-stage shift register of the test output data storage circuit during m clock cycles, and
shift the test output data stored in the m-th register into a next register of the m-stage shift register every rising transition of a clock signal.

20. A semiconductor package comprising:
a first semiconductor device having a plurality of micro-bumps on an active surface thereof and a plurality of bulk bumps on an inactive surface thereof, the plurality of bulk bumps connected through-silicon vias to the plurality of micro-bumps; and
a second semiconductor device vertically stacked on the first semiconductor device and connected to the first semiconductor device via the plurality of micro-bumps; the second semiconductor device having a short circuit detecting circuit including,
a plurality of data input/output pads each connected to respective ones of the plurality of micro-bumps,
a plurality of data output circuits each including a pull-up driver and a pull-down driver, the plurality of data output circuits each configured to drive respective ones of the plurality of data input/output pads,
a pull-up driver output control circuit configured to select, for each of the plurality of data output circuits, one of an off state, a weak-on state, and a strong-on state as an output of the pull-up driver associated therewith based on a micro-bump short circuit test type;
a pull-down driver output control circuit configured to select, for each of the plurality of data output circuits, one of the off state, the weak-on state, and the strong-on state as an output of the pull-down driver associated therewith based on the micro-bump short circuit test type;
a test input data storage circuit; and
a test output data storage circuit.

* * * * *